(12) United States Patent
Khlat et al.

(10) Patent No.: US 7,962,108 B1
(45) Date of Patent: Jun. 14, 2011

(54) ADAPTIVE AM/PM COMPENSATION

(75) Inventors: Nadim Khlat, Cugnaux (FR);
Alexander Wayne Hietala, Phoenix, AZ (US); Marcus Granger-Jones, Scotts Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 919 days.

(21) Appl. No.: 11/392,053

(22) Filed: Mar. 29, 2006

(51) Int. Cl.
*H04B 1/04* (2006.01)

(52) U.S. Cl. .................. 455/114.3; 455/127.1; 455/501

(58) Field of Classification Search .................. 375/296, 375/297; 455/114.1–114.3, 127.1–127.5, 455/501, 91, 102, 108, 110
See application file for complete search history.

(56) References Cited

U.S. PATENT DOCUMENTS

| | | | |
|---|---|---|---|
| 3,900,823 A | 8/1975 | Sokal et al. |
| 4,389,618 A | 6/1983 | Bauman |
| 4,609,881 A | 9/1986 | Wells |
| 4,837,786 A | 6/1989 | Gurantz et al. |
| 4,968,908 A | 11/1990 | Walls |
| 5,055,802 A | 10/1991 | Hietala et al. |
| 5,079,522 A | 1/1992 | Owen et al. |
| 5,313,411 A | 5/1994 | Tsujimoto |
| 5,430,416 A | 7/1995 | Black et al. |
| 5,444,415 A | 8/1995 | Dent et al. |
| 5,524,286 A | 6/1996 | Chiesa et al. |
| 5,598,436 A | 1/1997 | Brajal et al. |
| 5,608,353 A | 3/1997 | Pratt |
| 5,617,450 A | 4/1997 | Kakuishi et al. |
| 5,629,648 A | 5/1997 | Pratt |
| 5,822,011 A | 10/1998 | Rumreich |
| 5,900,778 A | 5/1999 | Stonick et al. |
| 5,952,895 A | 9/1999 | McCune, Jr. et al. |
| 6,008,703 A | 12/1999 | Perrott et al. |
| 6,101,224 A | 8/2000 | Lindoff et al. |
| 6,115,684 A | 9/2000 | Kawahara et al. |
| 6,130,579 A | 10/2000 | Iyer et al. |
| 6,141,390 A | 10/2000 | Cova |
| 6,191,656 B1 | 2/2001 | Nadler |
| 6,211,747 B1 | 4/2001 | Trichet et al. |
| 6,229,395 B1 | 5/2001 | Kay |
| 6,236,687 B1 | 5/2001 | Caso et al. |
| 6,236,703 B1 | 5/2001 | Riley |
| 6,236,837 B1 | 5/2001 | Midya |
| 6,240,278 B1 | 5/2001 | Midya et al. |
| 6,246,286 B1 | 6/2001 | Persson |

(Continued)

OTHER PUBLICATIONS

Johnson, Jackie, "Power Amplifier Design for Open Loop EDGE Large Signal Polar Modulation Systems," RFDesign, Jun. 2006, pp. 42-50.

(Continued)

*Primary Examiner* — Lana N Le

(74) *Attorney, Agent, or Firm* — Withrow & Terranova, P.L.L.C.

(57) ABSTRACT

A system and method for calibrating Amplitude Modulation to Phase Modulation (AM/PM) compensation circuitry in a mobile terminal operating according to a polar modulation scheme are provided. In general, during ramp-up for a transmit burst, measurements of a phase error between an input and output of power amplifier circuitry in the transmit chain are obtained. Using the phase error measurements, the AM/PM compensation circuitry is calibrated and used to provide AM/PM compensation for the same transmit burst. By calibrating the AM/PM compensation circuitry using the phase error measurements obtained during ramp-up, the AM/PM compensation circuitry is calibrated for the desired frequency band, sub-band, and power control level setting as well as for the current load conditions at the antenna and ambient temperature.

28 Claims, 8 Drawing Sheets

U.S. PATENT DOCUMENTS

| | | | |
|---|---|---|---|
| 6,271,727 B1 | 8/2001 | Schmukler |
| 6,275,685 B1 | 8/2001 | Wessel et al. |
| 6,285,239 B1 | 9/2001 | Iyer et al. |
| 6,288,610 B1 | 9/2001 | Miyashita |
| 6,295,442 B1 | 9/2001 | Camp, Jr. et al. |
| RE37,407 E | 10/2001 | Eisenberg et al. |
| 6,307,364 B1 | 10/2001 | Augustine |
| 6,329,809 B1 | 12/2001 | Dening et al. |
| 6,335,767 B1 | 1/2002 | Twitchell et al. |
| 6,356,150 B1 | 3/2002 | Spears et al. |
| 6,359,950 B2 | 3/2002 | Gossmann et al. |
| 6,366,177 B1 | 4/2002 | McCune et al. |
| 6,377,784 B2 | 4/2002 | McCune |
| 6,392,487 B1 | 5/2002 | Alexanian |
| 6,417,731 B1 | 7/2002 | Funada et al. |
| 6,462,617 B1 | 10/2002 | Kim |
| 6,489,846 B2 | 12/2002 | Hatsugai |
| 6,504,885 B1 | 1/2003 | Chen |
| 6,522,121 B2 | 2/2003 | Coumou |
| 6,581,082 B1 | 6/2003 | Opsahl |
| 6,587,514 B1 * | 7/2003 | Wright et al. ............... 375/296 |
| 6,642,786 B1 | 11/2003 | Jin et al. |
| 6,693,468 B2 | 2/2004 | Humphreys et al. |
| 6,700,929 B1 | 3/2004 | Shan et al. |
| 6,701,134 B1 | 3/2004 | Epperson |
| 6,701,138 B2 | 3/2004 | Epperson et al. |
| 6,720,831 B2 | 4/2004 | Dening et al. |
| 6,724,252 B2 | 4/2004 | Ngo et al. |
| 6,724,265 B2 | 4/2004 | Humphreys |
| 6,724,831 B1 | 4/2004 | Hasegawa et al. |
| 6,728,324 B1 | 4/2004 | Shan et al. |
| 6,731,145 B1 | 5/2004 | Humphreys et al. |
| 6,735,419 B2 | 5/2004 | Mitzlaff |
| 6,748,204 B1 | 6/2004 | Razavi et al. |
| 6,782,244 B2 | 8/2004 | Steel et al. |
| 6,798,843 B1 | 9/2004 | Wright et al. |
| 6,801,086 B1 | 10/2004 | Chandrasekaran |
| 6,807,406 B1 | 10/2004 | Razavi et al. |
| 6,816,718 B2 | 11/2004 | Yan et al. |
| 6,819,914 B2 | 11/2004 | Yan et al. |
| 6,819,941 B2 | 11/2004 | Dening et al. |
| 6,831,506 B1 | 12/2004 | Moffat et al. |
| 6,834,084 B2 | 12/2004 | Hietala |
| 6,836,517 B2 | 12/2004 | Nagatani et al. |
| 6,900,778 B1 | 5/2005 | Yamamoto |
| 6,901,039 B1 | 5/2005 | Sugie et al. |
| 6,901,514 B1 | 5/2005 | Iu et al. |
| 6,903,604 B2 | 6/2005 | Kim |
| 6,914,943 B1 | 7/2005 | Shimizu |
| 6,975,688 B2 | 12/2005 | Rexberg et al. |
| H2143 H | 2/2006 | Prockup |
| 7,010,276 B2 | 3/2006 | Sander et al. |
| 7,010,280 B1 | 3/2006 | Wilson |
| 7,012,969 B2 | 3/2006 | Ode et al. |
| 7,054,385 B2 | 5/2006 | Booth et al. |
| 7,109,791 B1 | 9/2006 | Epperson et al. |
| 7,113,036 B2 | 9/2006 | Moffatt et al. |
| 7,113,551 B2 | 9/2006 | Sills et al. |
| 7,158,494 B2 | 1/2007 | Sander et al. |
| 7,349,490 B2 | 3/2008 | Hunton |
| 7,369,813 B2 | 5/2008 | Andersson |
| 7,457,586 B1 | 11/2008 | Hietala et al. |
| 7,529,523 B1 | 5/2009 | Young et al. |
| 7,542,520 B1 | 6/2009 | Estrada |
| 7,593,698 B1 | 9/2009 | Johnson et al. |
| 2001/0022532 A1 | 9/2001 | Dolman |
| 2001/0033238 A1 | 10/2001 | Velazquez |
| 2002/0008578 A1 | 1/2002 | Wright et al. |
| 2002/0021764 A1 | 2/2002 | Posti |
| 2002/0041210 A1 * | 4/2002 | Booth et al. ............... 330/149 |
| 2002/0044014 A1 | 4/2002 | Wright et al. |
| 2002/0060606 A1 | 5/2002 | Andre |
| 2002/0093378 A1 | 7/2002 | Nielsen et al. |
| 2002/0113905 A1 | 8/2002 | Lee |
| 2002/0160821 A1 | 10/2002 | Kaikati et al. |
| 2002/0167923 A1 | 11/2002 | Sendonaris et al. |
| 2003/0012289 A1 | 1/2003 | Lindoff |
| 2003/0020538 A1 | 1/2003 | Kim |
| 2003/0087617 A1 | 5/2003 | Shohara |
| 2003/0133518 A1 | 7/2003 | Koomullil et al. |
| 2003/0161487 A1 | 8/2003 | Husted et al. |
| 2003/0179830 A1 | 9/2003 | Eidson et al. |
| 2003/0197558 A1 | 10/2003 | Bauder et al. |
| 2003/0197559 A1 | 10/2003 | Ghannouchi et al. |
| 2003/0215025 A1 | 11/2003 | Hietala |
| 2003/0215026 A1 | 11/2003 | Hietala |
| 2003/0227342 A1 | 12/2003 | Liu |
| 2004/0072597 A1 | 4/2004 | Epperson et al. |
| 2004/0121741 A1 | 6/2004 | Rashev et al. |
| 2004/0131129 A1 | 7/2004 | Harron et al. |
| 2004/0183511 A1 | 9/2004 | Dening |
| 2004/0198414 A1 | 10/2004 | Hunton |
| 2004/0208157 A1 | 10/2004 | Sander et al. |
| 2005/0002470 A1 | 1/2005 | Saed et al. |
| 2005/0018765 A1 | 1/2005 | Endres et al. |
| 2005/0156662 A1 | 7/2005 | Raghupathy et al. |
| 2005/0195919 A1 | 9/2005 | Cova |
| 2006/0050812 A1 * | 3/2006 | Hietala et al. ............... 375/308 |
| 2006/0071711 A1 | 4/2006 | Persson et al. |
| 2006/0178120 A1 | 8/2006 | Puma |
| 2006/0203899 A1 | 9/2006 | Gee |
| 2006/0280502 A1 | 12/2006 | Sekine et al. |
| 2007/0110199 A1 | 5/2007 | Momtaz et al. |
| 2007/0129025 A1 * | 6/2007 | Vasa et al. ............... 455/114.2 |
| 2007/0190952 A1 | 8/2007 | Waheed et al. |
| 2008/0219332 A1 | 9/2008 | Brehler |
| 2008/0310617 A1 | 12/2008 | Daecke et al. |
| 2009/0252255 A1 | 10/2009 | Lee et al. |

OTHER PUBLICATIONS

Pinto et al., "Phase Distortion and Error Vector Magnitude for 8-PSK Systems," London Communications Symposium, Sep. 14-15, 2000, University College London, London, England.

Ray Andraka, "A Survey of CORDIC Algorithms for FPGA Based Computers," Association for Computing Machinery, 0-89791-978-5, 1998.

Jack E. Volder, "The CORDIC Trigonometric Computing Technique," IRE Transactions on Electronic Computers, p. 330, Sep. 1959.

Cusinato, Paolo, "Gain/Bandwidth Programmable PA Control Loop for GSM/GPRS Quad-Band Cellular Handsets," IEEE Journal of Solid-State Circuits, Jun. 2004, 960-966, vol. 39, No. 6, IEEE.

Notice of Allowance from U.S. Appl. No. 10/139,560 mailed Sep. 23, 2004.

Non-Final Rejection from from U.S. Appl. No. 10/139,560 mailed Jul. 9, 2003.

Final Rejection from U.S. Appl. No. 10/147,569 mailed Feb. 2, 2010.

Non-Final Rejection from U.S. Appl. No. 10/147,569 mailed May 12, 2009.

Final Rejection from U.S. Appl. No. 10/147,569 mailed Sep. 4, 2008.

Non-Final Rejection from U.S. Appl. No. 10/147,569 mailed Feb. 21, 2008.

Final Rejection from U.S. Appl. No. 10/147,569 mailed Mar. 8, 2006.

Non-Final Rejection from U.S. Appl. No. 10/147,569 mailed Sep. 20, 2005.

Final Rejection from U.S. Appl. No. 10/147,579 mailed Feb. 2, 2010.

Non-Final Rejection from U.S. Appl. No. 10/147,579 mailed Aug. 17, 2009.

Final Rejection from U.S. Appl. No. 10/147,579 mailed Apr. 1, 2009.

Non-Final Rejection from U.S. Appl. No. 10/147,579 mailed Oct. 1, 2008.

Final Rejection from U.S. Appl. No. 10/147,579 mailed Apr. 29, 2008.

Non-Final Rejection from U.S. Appl. No. 10/147,579 mailed Oct. 30, 2007.

Final Rejection from U.S. Appl. No. 10/147,579 mailed May 17, 2007.

Non-Final Rejection from U.S. Appl. No. 10/147,579 mailed Dec. 29, 2006.

Final Rejection from U.S. Appl. No. 10/147,579 mailed Mar. 16, 2006.

Non-Final Rejection from U.S. Appl. No. 10/147,579 mailed Sep. 20, 2005.
Non-Final Rejection from U.S. Appl. No. 10/874,509 mailed Aug. 4, 2008.
Non-Final Rejection from U.S. Appl. No. 10/874,509 mailed Oct. 17, 2007.
Non-Final Rejection from U.S. Appl. No. 11/847,044 mailed Dec. 24, 2008.
Non-Final Rejection from U.S. Appl. No. 11/847,044 mailed Apr. 16, 2008.
Notice of Allowance from U.S. Appl. No. 10/859,718 mailed Jun. 14, 2007.
Notice of Allowance from U.S. Appl. No. 11/209,435 mailed Dec. 9, 2008.
Examiner's Answer to Appeal Brief from U.S. Appl. No. 11/151,022 mailed Dec. 12, 2008.
Final Rejection from U.S. Appl. No. 11/151,022 mailed Apr. 15, 2008.
Non-Final Rejection from U.S. Appl. No. 11/151,022 mailed Oct. 3, 2007.
Final Rejection from U.S. Appl. No. 11/195,379 mailed Jan. 26, 2009.
Non-Final Rejection from U.S. Appl. No. 11/195,379 mailed Jul. 21, 2008.
Notice of Allowance from U.S. Appl. No. 11/347,957 mailed Jun. 25, 2010.
Non-Final Rejection from U.S. Appl. No. 11/347,957 mailed Dec. 24, 2009.
Non-Final Rejection from U.S. Appl. No. 11/347,957 mailed Mar. 30, 2009.
Notice of Allowance from U.S. Appl. No. 11/548,876 mailed Nov. 16, 2009.
Non-Final Rejection from U.S. Appl. No. 11/548,876 mailed Mar. 31, 2009.
Non-Final Rejection from U.S. Appl. No. 11/736,131 mailed Apr. 1, 2010.
Non-Final Rejection from U.S. Appl. No. 11/736,176 mailed Sep. 29, 2010.
Nonfinal Office Action mailed Feb. 17, 2011 regarding U.S. Appl. No. 11/736,176.

* cited by examiner

ADAPTIVE AM/PM COMPENSATION

FIELD OF THE INVENTION

The present invention relates to a mobile terminal operating according to a polar modulation scheme, and more particularly relates to a compensating Amplitude Modulation to Phase Modulation (AM/PM) distortion in a transmitter operating according to a polar modulation scheme.

BACKGROUND OF THE INVENTION

Many different standards and modulation schemes exist, but one of the most prevalently used in the world of mobile terminals is the Global System for Mobile Communications (GSM). One of the modulation schemes of the GSM standard is the Enhanced Data Rates for GSM Evolution (EDGE) modulation scheme. The EDGE modulation scheme contains an amplitude modulation component and a phase modulation component. Since there is an amplitude modulation component, the power amplifier of a transmitter operating according to the EDGE modulation scheme must be linear or driven according to a polar modulation scheme.

If a polar modulation scheme is used, a phase modulated signal at the desired radio frequency is provided to the input of the power amplifier and an amplitude modulation component is used to vary the supply voltage provided to the power amplifier. As a result, the power amplifier may operate in saturation and efficiency is greatly improved. Unfortunately, the amplitude modulation component that controls the supply voltage provided to the power amplifier causes unwanted phase components to be created in the output of the power amplifier due to the non-linearities of the power amplifier. This is sometimes called Amplitude Modulation to Phase Modulation (AM/PM) distortion, and it degrades the spectral purity of the system and the Error Vector Magnitude (EVM).

In order to compensate for the AM/PM distortion, polar modulation systems may pre-distort the phase modulation component provided to the power amplifier such that the AM/PM distortion at the output of the power amplifier is substantially reduced. As an example, see commonly owned and assigned U.S. Patent Application Publication No. 2003/0215025, entitled AM TO PM CORRECTION SYSTEM FOR POLAR MODULATOR, filed May 16, 2002, which is hereby incorporated by reference in its entirety.

One issue with AM/PM pre-distortion, or compensation, is that the AM/PM distortion is dependent on the Voltage Standing Wave Ratio (VSWR) condition at the antenna of the mobile terminal as well as temperature. Previous techniques used to calibrate the AM/PM pre-distortion, or compensation, of a mobile terminal calibrate the AM/PM pre-distortion for ideal temperature and load conditions. However, the load, and thus VSWR condition, at the antenna of the mobile device may vary depending on various environmental factors such as the user placing the mobile terminal near a metallic object. In addition, the ambient temperature of the environment in which the mobile terminal is operating may also change. When the VSWR condition or temperature changes, so too does the AM/PM distortion of the power amplifier of the mobile terminal. As such, there remains a need for an adaptive process for calibrating AM/PM pre-distortion in a mobile terminal operating according to a polar modulation scheme.

SUMMARY OF THE INVENTION

The present invention relates to a system and method for calibrating Amplitude Modulation to Phase Modulation (AM/PM) compensation circuitry in a mobile terminal operating according to a polar modulation scheme. In general, during ramp-up for a transmit burst, measurements of a phase error between an input and output of power amplifier circuitry in the transmit chain are obtained. Using the phase error measurements, the AM/PM compensation circuitry is calibrated and used to provide AM/PM compensation for the same transmit burst. By calibrating the AM/PM compensation circuitry using the phase error measurements obtained during ramp-up, the AM/PM compensation circuitry is calibrated for the desired frequency band, sub-band, and power control level setting as well as for the current load conditions at the antenna and ambient temperature.

In one embodiment, the AM/PM compensation circuitry includes seed compensation circuitry, which is preferably one or more seed look-up tables (LUTs), and adaptive compensation circuitry, which is preferably an adaptive LUT. The seed LUTs are calibrated by, for example, a factory calibration process under ideal load and temperature conditions. There may be a separate seed LUT for each sub-band of each of a number of frequency bands in which the mobile terminal may operate. In addition, there may be separate seed LUTs for each of a high power and low power setting of the power amplifier circuitry. The adaptive LUT is calibrated based on the phase error measurements obtained during ramp-up for the transmit burst.

In operation, the AM/PM compensation provides AM/PM compensation during ramp-up for the transmit burst based on a select one of the seed LUTs corresponding to the desired frequency band, sub-band, and high or low power setting combination. During ramp-up for the transmit burst, the phase error measurements are obtained and used to calibrate the adaptive LUT. Once the adaptive LUT is calibrated, the AM/PM compensation circuitry switches from the select seed LUT to the adaptive LUT to provide AM/PM compensation for the remainder of the transmit burst. A phase offset may be applied to the output of the adaptive LUT in order to maintain phase continuity after switching from the select seed LUT to the adaptive LUT.

In addition, prior to ramp-up, a power level of any interferers present at the antenna of the mobile terminal may be detected. If an interferer having a power level above a predetermined threshold is present, the AM/PM compensation circuitry may provide AM/PM compensation using the select seed LUT throughout the entire transmit burst rather than switching to the adaptive LUT. This may be desired because the strong interferer may corrupt the phase measurements used to calibrate the adaptive LUT.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 7:
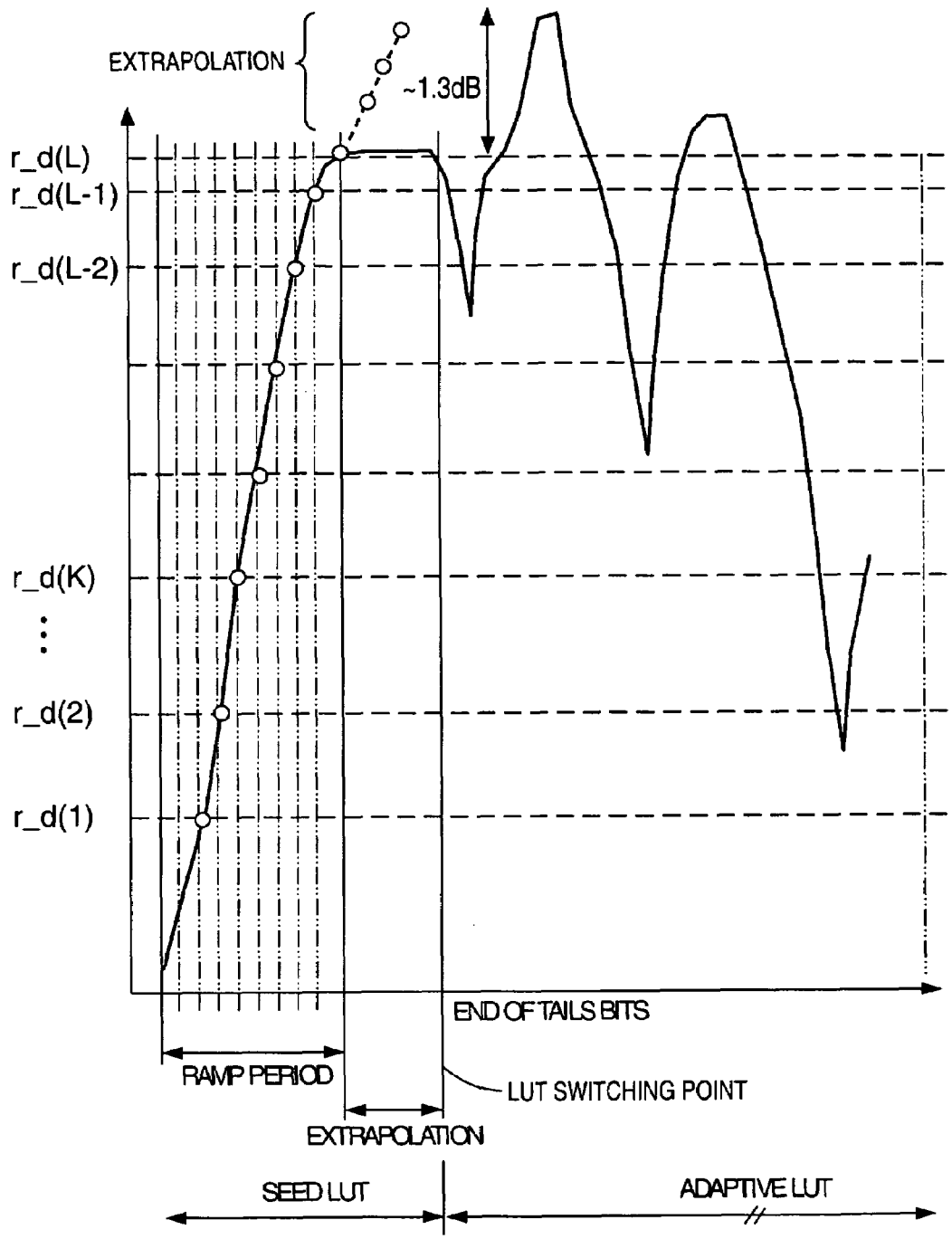
Figure 8:
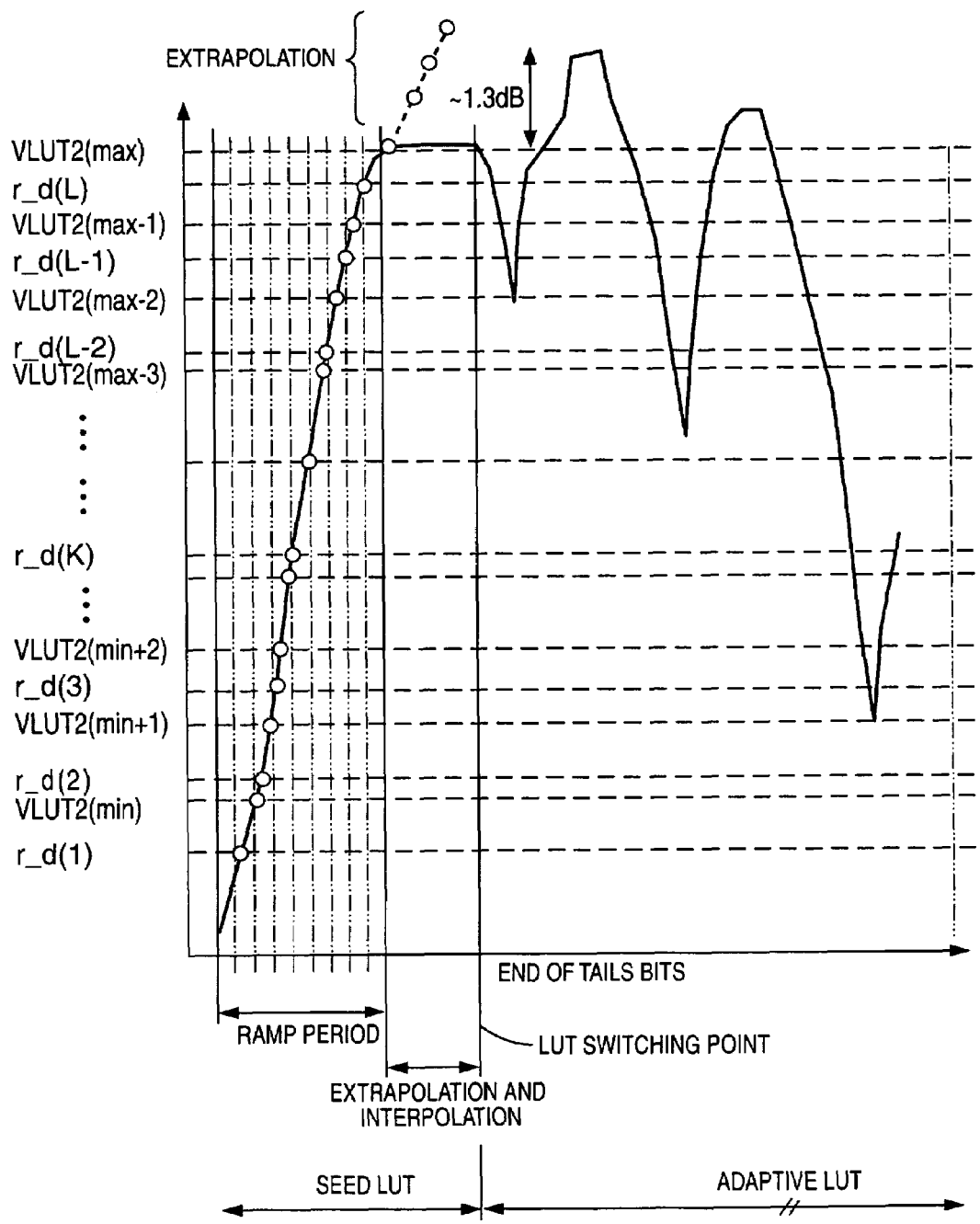

FIG. 7 is a graphical illustration of the beginning of a transmit burst wherein phase error measurements are obtained during ramp-up for the transmit burst according to one embodiment of the present invention; and FIG. 8 is a graphical illustration of the beginning of a transmit burst wherein desired phase error values are determined based on phase error measurements according to one embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a system and method for calibrating Amplitude Modulation to Phase Modulation (AM/PM) compensation circuitry in a mobile terminal operating according to a polar modulation scheme. In general, during ramp-up for a transmit burst, measurements of a phase error between an input and output of power amplifier circuitry in the transmit chain are obtained. Using the phase error measurements, the AM/PM compensation circuitry is calibrated and used to provide AM/PM compensation for the same transmit burst. By calibrating the AM/PM compensation circuitry using the phase error measurements obtained during ramp-up, the AM/PM compensation circuitry is calibrated for the desired frequency band, sub-band, and power control level setting as well as for the current Voltage Standing Wave Ratio (VSWR) conditions at the antenna and ambient temperature.

Figure 1:
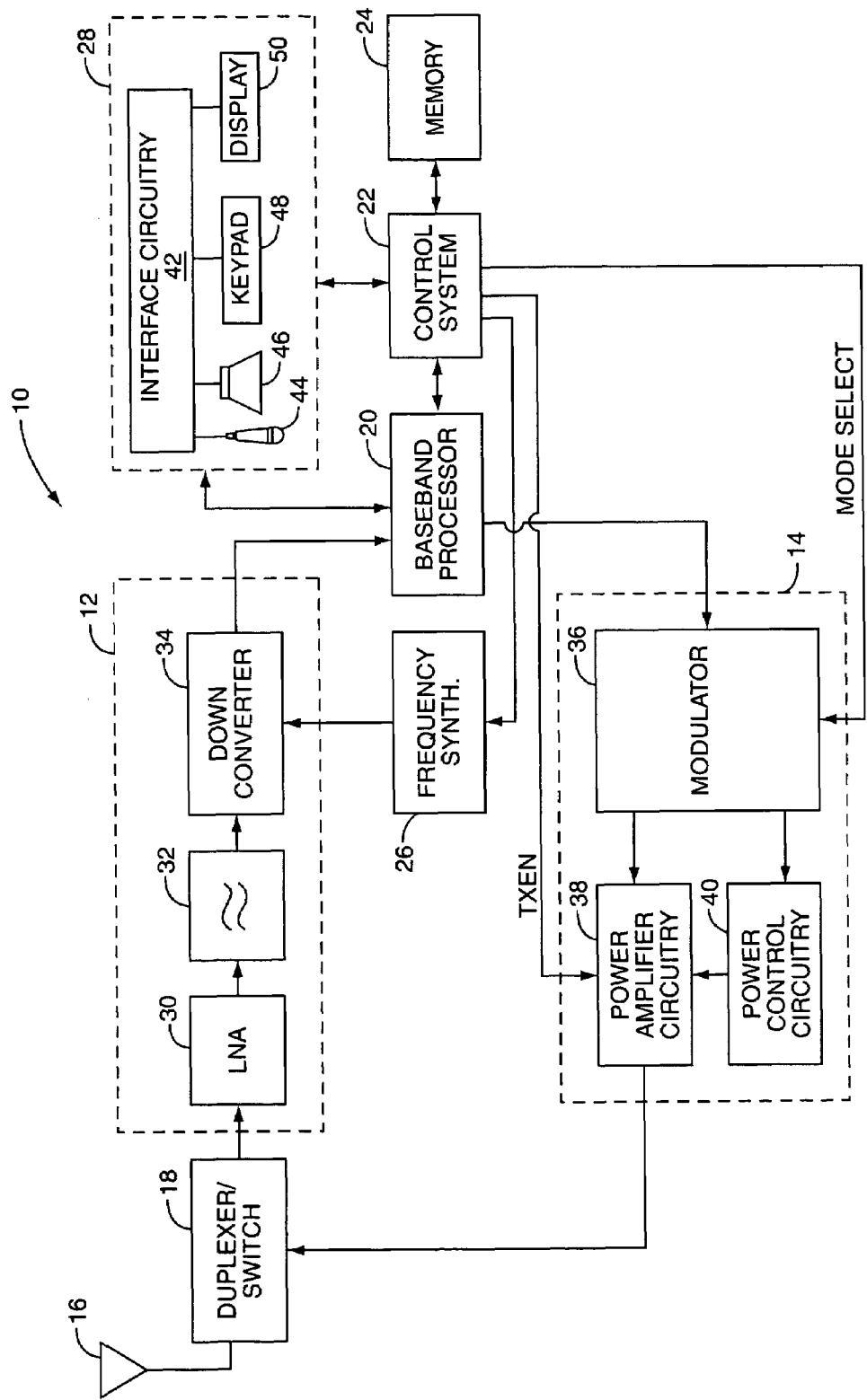
FIG. 1 illustrates an exemplary mobile terminal according to one embodiment of the present invention.

The present invention is preferably incorporated in a mobile terminal 10, such as a mobile telephone, personal digital assistant, wireless Local Area Network (LAN) device, a base station in a mobile network, or the like. The basic architecture of a mobile terminal 10 is represented in FIG. 1, and may include a receiver front end 12, a radio frequency transmitter section 14, an antenna 16, a duplexer or switch 18, a baseband processor 20, a control system 22, memory 24, a frequency synthesizer 26, and an interface 28. The receiver front end 12 receives information bearing radio frequency signals from one or more remote transmitters provided by a base station (not shown). A low noise amplifier 30 amplifies the signal. A filter circuit 32 minimizes broadband interference in the received signal, while a downconverter 34 downconverts the filtered, received signal to an intermediate or baseband frequency signal, which is then digitized into one or more digital streams. The receiver front end 12 typically uses one or more mixing frequencies generated by the frequency synthesizer 26.

The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The control system 22 may run software stored in the memory 24. Alternatively, the operation of the control system 22 may be a function of sequential logic structures as is well understood. After encoding the data from the control system 22, the baseband processor 20 outputs the encoded data to the radio frequency transmitter section 14. A modulator 36 receives the data from the baseband processor 20 and operates according to one or more modulation schemes to provide a modulated signal to the power amplifier circuitry 38. The modulation scheme of the modulator 36 is controlled by a mode select signal (MODE SELECT) from the control system 22.

In one embodiment, the modulator 36 operates according to the Global System for Mobile Communications (GSM) standard to provide either 8-Level Phase Shift Keying (8PSK) modulation, which is a modulation scheme containing both amplitude and phase components, or Gaussian Minimum Shift Keying (GMSK) modulation, which is a constant amplitude modulation scheme. When in 8PSK mode, the modulator 36 provides a phase modulation component at a desired transmit frequency to the power amplifier circuitry 38 and an amplitude modulation component to the power control circuitry 40. The power control circuitry 40 controls an output power of the power amplifier circuitry 38 based on the amplitude modulation component or, optionally, a combination of a ramping signal and the amplitude modulation component, thereby providing amplitude modulation of the phase modulation component. When in GMSK mode, the modulator 36 provides a phase modulated signal to the power amplifier circuitry 38 and the ramping signal to the power control circuitry 40, where the power control circuitry 40 controls the output power of the power amplifier circuitry 38 based on the ramping signal.

The power amplifier circuitry 38 amplifies the modulated signal from the modulator 36 to a level appropriate for transmission from the antenna 16. A gain of the power amplifier circuitry 38 is controlled by the power control circuitry 40. In essence, the power control circuitry 40 operates to control a supply voltage provided to the power amplifier circuitry 38. When in 8PSK mode, the power control circuitry 40 controls the supply voltage based on the amplitude modulation component or, optionally, a combination of the amplitude modulation component and the ramping signal from the modulator 36. When in GMSK mode, the power control circuitry 40 operates to control the supply voltage provided to the power amplifier circuitry 38 based on the ramping signal.

A user may interact with the mobile terminal 10 via the interface 28, which may include interface circuitry 42 associated with a microphone 44, a speaker 46, a keypad 48, and a display 50. The interface circuitry 42 typically includes analog-to-digital converters, digital-to-analog converters, amplifiers, and the like. Additionally, it may include a voice encoder/decoder, in which case it may communicate directly with the baseband processor 20.

The microphone 44 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 46 by the interface circuitry 42. The keypad 48 and display 50 enable the user to interact with the mobile terminal 10, input numbers to be dialed and address book information, or the like, as well as monitor call progress information.

Figure 2:
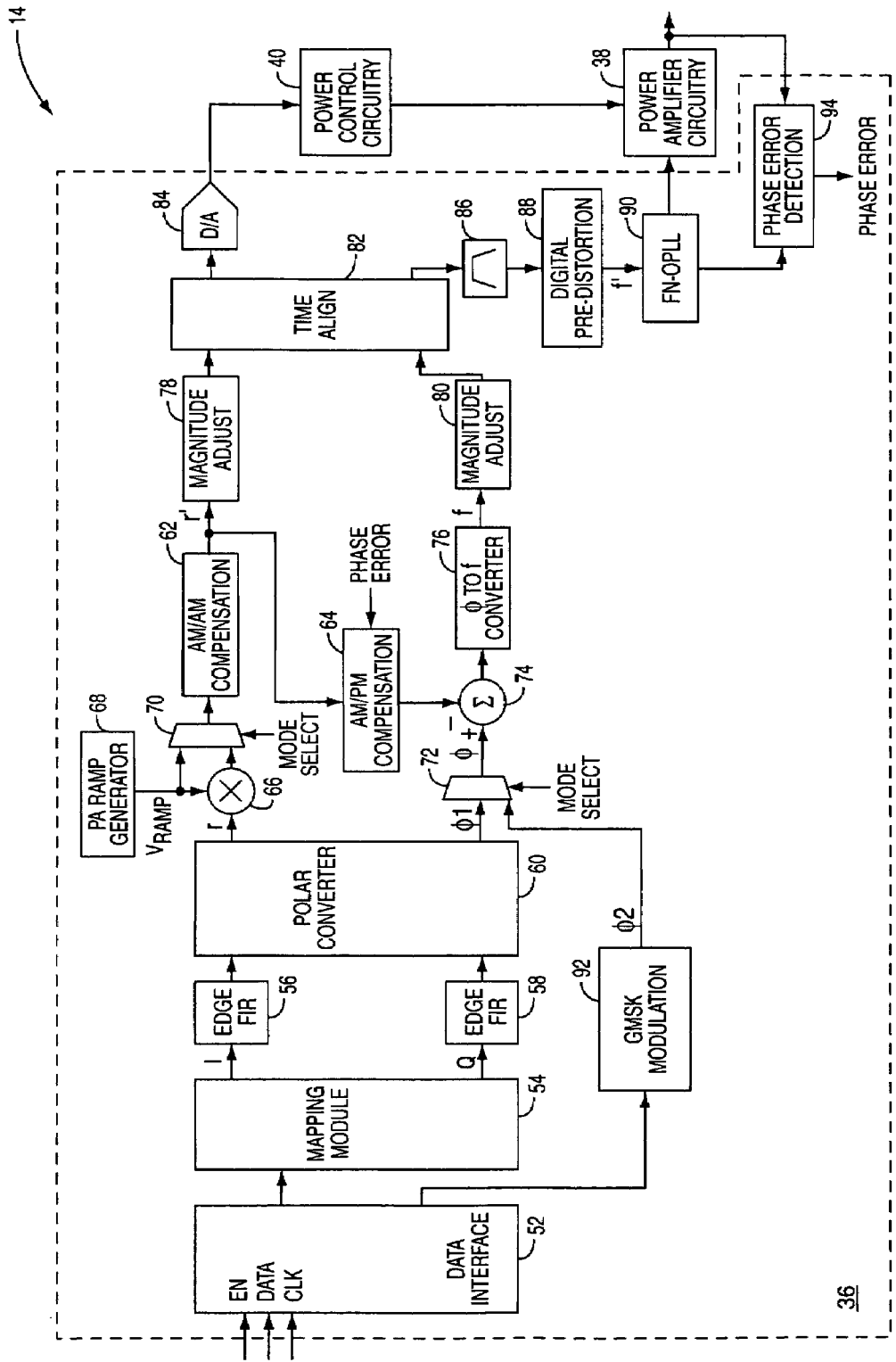
FIG. 2 illustrates an exemplary embodiment of the modulator of the mobile terminal of FIG. 1 according to one embodiment of the present invention.

FIG. 2 illustrates an exemplary embodiment of the modulator 36 wherein the modulator 36 operates in either an 8PSK mode or a GMSK mode. It should be noted 8PSK and GMSK are exemplary modulation schemes and are not intended to limit the scope of the present invention. As illustrated, the modulator 36 includes several components, including a data interface 52, a mapping module 54, first and second filters 56, 58, and a polar converter 60. Other components of the modulator 36 will be discussed below. It should be noted that the data interface 52 may include First In First Out (FIFO) circuitry or may alternatively be a real time serial data interface.

The mapping module 54, the filters 56 and 58, and the polar converter 60 form part of an 8PSK modulator. As discussed below, the 8PSK modulator also includes Amplitude Modulation to Amplitude Modulation (AM/AM) compensation circuitry 62, Amplitude Modulation to Phase Modulation (AM/PM) compensation circuitry 64, and various other components.

When in 8PSK mode, the data interface 52 receives data from the baseband processor 20 (FIG. 1) at the bit rate of the system. This data is passed to the mapping module 54, where the data is grouped into symbols of three consecutive data bits, Grey coded, and rotated by $3\pi/8$ on each symbol as per European Telecommunications Standards Institute (ETSI) specifications. The resulting symbol is mapped to one of sixteen points in an in-phase (I), quadrature phase (Q) constellation.

Both the in-phase (I) and the quadrature phase (Q) components for each point are then filtered by the first and second filters 56, 58, respectively. In an exemplary embodiment, the first and second filters 56, 58 are EDGE finite impulse response (FIR) filters. This, as dictated by the ETSI specifications, shapes the response between symbol times.

After filtering, both the in-phase (I) and the quadrature phase (Q) components are sent to the polar converter 60. The polar converter 60 uses a classical coordinate rotation digital computer (CORDIC) algorithm or like rectangular to polar conversion technique. Thus, the polar converter 60 generates phase ($\phi$) and amplitude (r) equivalent signals. Further information about CORDIC algorithms may be found in *Proceedings of the 1998 ACM/SIGDA Sixth International Symposium On Field Programmable Gate Arrays* by Ray Andraka, February 22-24, pp. 191-200 and "The CORDIC Trigonometric Computing Technique" by Jack E. Volder, *IRE Trans on Elect. Computers*, p. 330, 1959, both of which are hereby incorporated by reference in their entireties.

The amplitude signal (r) from the polar converter 60 is provided to a first input of a multiplier 66. A power amplifier (PA) ramp generator 68 generates a ramping signal ($V_{RAMP}$) and provides the ramping signal ($V_{RAMP}$) to a second input of the multiplier 66. The ramping signal ($V_{RAMP}$) is generated to define the transmit burst. A magnitude of the ramping signal ($V_{RAMP}$) may be controlled to control an output power level of the power amplifier circuitry 38. The multiplier 66 operates to multiply the amplitude signal (r) and the ramping signal ($V_{RAMP}$) to provide an output signal. The output signal from the multiplier 66 and the ramping signal ($V_{RAMP}$) are provided to a switch 70, which is controlled by the mode select signal (MODE SELECT). In 8PSK mode, the switch 70 is controlled such that the output of the multiplier 66 is output by the switch 70.

From the switch, the amplitude signal (r) is directed to the AM/AM compensation circuitry 62. The AM/AM compensation circuitry 62 introduces a compensation term to the amplitude signal from the output of the switch 70 that, after further processing, counteracts the distortion introduced by AM/AM conversion, or distortion, in the power amplifier circuitry 38. Further details of an exemplary embodiment of the AM/AM compensation circuitry 62 can be found in commonly owned and assigned U.S. Patent Application Publication No. 2003/0215026, entitled AM TO AM CORRECTION SYSTEM FOR POLAR MODULATOR, filed May 16, 2002, which is hereby incorporated by reference in its entirety.

The phase signal ($\phi 1$) from the polar converter 60 is directed to a switch 72, which is controlled by the mode select signal (MODE SELECT). In 8PSK mode, the switch 72 is controlled to output the phase signal (41) as a phase signal ($\phi$). Based on the pre-distorted amplitude signal (r') from the AM/AM compensation circuitry 62, the AM/PM compensation circuitry 64 introduces a compensation term to the phase signal ($\phi$) via subtraction circuitry 74 that, after further processing, counteracts the distortion introduced by AM/PM conversion, or distortion, in the power amplifier circuitry 38. According to the present invention, the AM/PM compensation circuitry 64 is calibrated during ramp-up of each transmit burst based on measurements of a phase error between an input of the power amplifier circuitry 38 and an output of the power amplifier circuitry 38 in order to provide robust AM/PM compensation over varying VSWR and temperature conditions, as discussed below in detail.

The output of the subtraction circuitry 74, which is referred to herein as a combined signal, is directed to a phase-to-frequency converter 76. The output of the phase-to-frequency converter 76 is a frequency signal (f), which generally corresponds to the desired frequency deviation of the modulated signal. Magnitude adjusters 78, 80 then adjust the magnitude of the pre-distorted amplitude signal (r') and the frequency signal (f), respectively, to a level expected by a time aligner 82, such that they comply with the appropriate standard. Next, a relative time delay is applied as necessary to the signals for best Error Vector Magnitude (EVM) and spectrum by the time aligner 82, such that the time aligner 82 provides the time-aligned pre-distorted amplitude signal (r') and frequency signal (f). Because these are preferably digital components, concerns about variations in analog components and the corresponding variation in time delays downstream are minimized.

At this point, the amplitude signal and the frequency signal separate and proceed by different paths, an amplitude signal processing path and a frequency signal processing path, to the power amplifier circuitry 38. With respect to the amplitude signal processing path, when in the 8PSK mode, the time-aligned pre-distorted amplitude signal, which may be referred to as a digital power control signal, is converted to an analog power control signal by a digital-to-analog (D/A) converter 84. The analog power control signal is used by the power control circuitry 40 to set the collector voltage on the power amplifier circuitry 38. As the amplitude signal changes, the voltage at the power amplifier circuitry 38 collector changes, and the output power will vary as $V^2/R_{out}$ ($R_{out}$ is not shown, but is effectively the load on the power amplifier circuitry 38). This is sometimes known as "plate modulation."

The time-aligned frequency signal from the time aligner 82 is directed to a digital filter 86 and digital pre-distortion circuitry 88 to provide a pre-distorted frequency signal (f'') to a fractional-N offset phase locked loop (FN-OPLL) 90. Details of the FN-OPLL 90 can be found in U.S. patent application Ser. No. 11/047,258, entitled FRACTIONAL-N OFFSET PHASE LOCKED LOOP, filed Jan. 31, 2005, which is hereby incorporated by reference in its entirety. Due to the closed loop frequency response or transfer function of the FN-OPLL 90, which is basically a low-pass response, the FN-OPLL 90 has an upper limit for permissible modulation rates. The pre-distortion applied by the digital pre-distortion circuitry 88 operates to extend the allowable range of modulation rates that may be passed through the FN-OPLL 90. More specifically, the pre-distortion applied by the digital pre-distortion circuitry 88 is such that the convolution, or cascade, of the pre-distortion and the transfer function of the FN-OPLL 90 results in a substantially flat frequency response in amplitude, phase, and group delay for a range of modulation rates greater than the range of modulation rates that would be permissible for the FN-OPLL 90 without the digital pre-distortion circuitry 88. A detailed discussion of the digital pre-distortion circuitry 88 can be found in U.S. patent application Ser. No. 11/347,956, entitled PRE-DISTORTION SYSTEM FOR A SYNTHESIZER HAVING MODULATION APPLIED IN THE REFERENCE PATH, filed Feb. 6, 2006, which is hereby incorporated by reference in its entirety.

After the frequency signal is pre-distorted, the pre-distorted frequency signal (f''), which is a digital signal, is provided to the FN-OPLL 90 to provide direct digital modulation in a manner similar to that described in commonly owned and assigned U.S. Pat. No. 6,834,084, entitled DIRECT DIGITAL POLAR MODULATOR, issued Dec. 21, 2004, which is hereby incorporated by reference in its entirety. The FN-OPLL 90 generates an output at the desired radio frequency. In one embodiment, the data interface 52 provides a digital data interface to the baseband processor 20 (FIG. 1), and the entire phase path from the data interface 52 to the FN-OPLL 90 is a digital path.

The modulator 36 also includes a GMSK modulator, which includes the GMSK modulation circuitry 92. When in GMSK mode, the GMSK modulation circuitry 92 processes the data to generate a phase signal ($\phi 2$). In one embodiment, the GMSK modulation circuitry 92 is a look-up table. Another exemplary embodiment of the GMSK modulation circuitry 92 is discussed in U.S. Pat. No. 5,825,257, entitled GMSK MODULATOR FORMED OF PLL TO WHICH CONTINUOUS PHASE MODULATED SIGNAL IS APPLIED, issued Oct. 20, 1998, which is hereby incorporated by reference in its entirety. It should be appreciated that other embodiments of the GMSK modulation circuitry 92 may also be used and the particular circuitry is not central to the present invention.

The phase signal ($\phi 2$) from GMSK modulation circuitry 92 is provided to the switch 72. In GMSK mode, the switch 72 is controlled to output the phase signal ($\phi 2$) from the GMSK modulation circuitry 92. As discussed above, the phase signal ($\phi$) output by the switch 72 is pre-distorted via AM/PM compensation circuitry 64 and the subtraction circuitry 74, converted to the frequency signal (f) via the phase-to-frequency converter 76, and adjusted and time-aligned via the magnitude adjuster 80 and time aligner 82.

As for the amplitude signal, the switch 70 is controlled such that the ramping signal ($V_{RAMP}$), rather than the output of the multiplier 66, is provided to the AM/AM compensation circuitry 62 and the AM/PM compensation circuitry 64. As such, the output of the switch 70 has no amplitude modulation component, other than the ramp-up and ramp-down waveforms, as is desired for GMSK mode. As discussed above, the pre-distorted amplitude signal (r') from the AM/AM compensation circuitry 62 is magnitude adjusted and time aligned by the magnitude adjuster 78 and time aligner 82.

At this point, the amplitude signal and the frequency signal output by the time aligner 82 separate and proceed by different paths to the power amplifier circuitry 38. With respect to the amplitude signal processing path, the time-aligned pre-distorted amplitude signal, which may be referred to as a digital power control signal, is converted to an analog power control signal by a digital-to-analog (D/A) converter 84. The analog power control signal is used by the power control circuitry 40 to set the collector voltage on the power amplifier circuitry 38. As with 8PSK mode, the frequency signal from the time aligner 82 is directed to the digital filter 86, the digital pre-distortion circuitry 88, and the FN-OPLL 90. The FN-OPLL 90 generates the output at the desired radio frequency.

According to the present invention, phase error detection circuitry 94 operates to obtain measurements of the AM/PM distortion of the power amplifier circuitry 38 by essentially measuring a phase error between an input of the power amplifier circuitry 38 and an output of the power amplifier circuitry 38 during ramp-up for a transmit burst. Using the phase error measurements (PHASE ERROR), the AM/PM compensation circuitry 64 is calibrated to compensate for the AM/PM distortion of power amplifier circuitry 38 for the same transmit burst. As such, AM/PM compensation is accurately provided to compensate for the AM/PM distortion of the power amplifier circuitry 38 under varying VSWR and varying temperature conditions.

Figure 3:
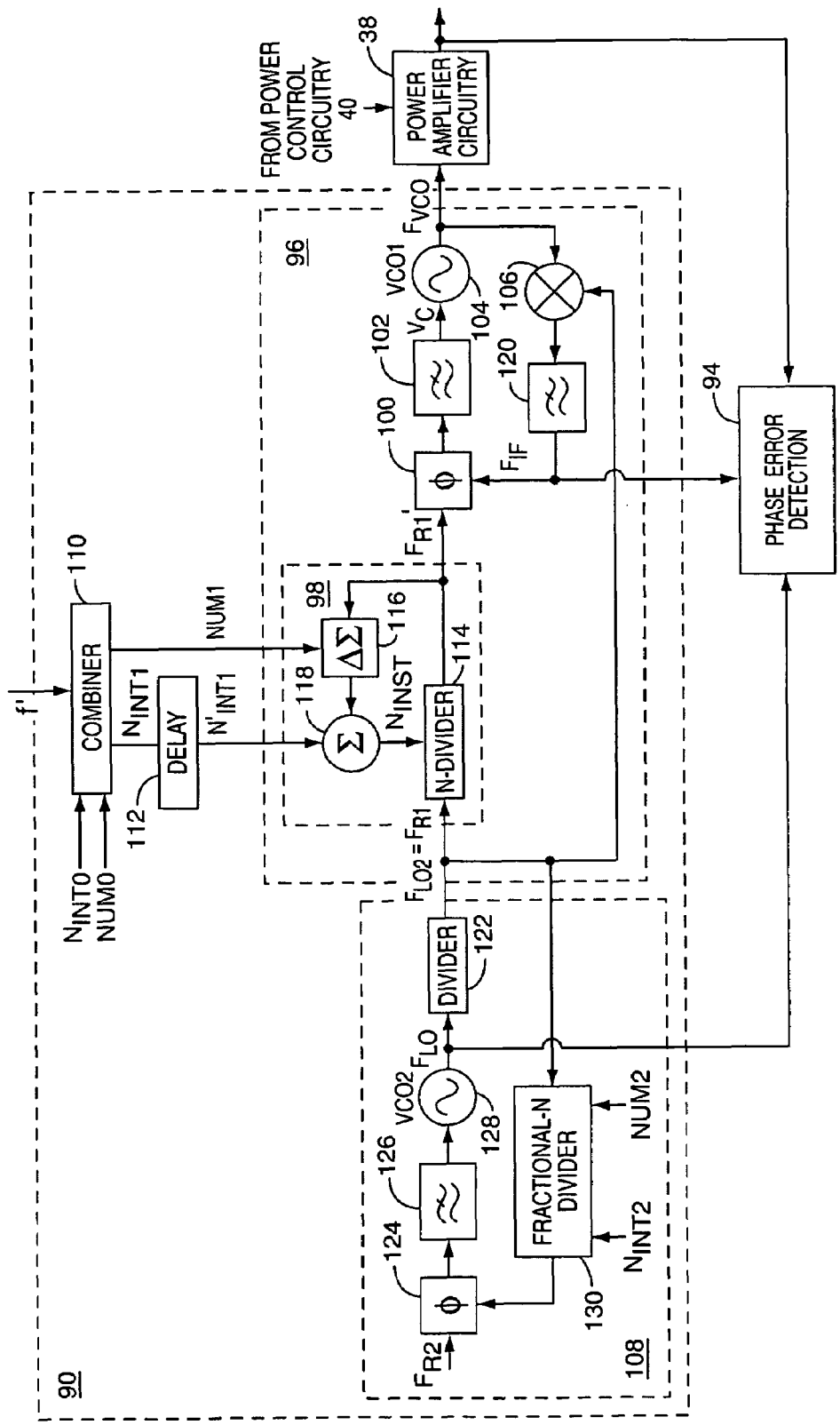
FIG. 3 illustrates the Fractional-N Offset Phase Lock Loop (FN-OPLL) and phase error detection circuitry of FIG. 2 according to one embodiment of the present invention.

FIG. 3 is a detailed block diagram of the FN-OPLL 90 according to one embodiment of the present invention. In general, the FN-OPLL 90 includes a first phase lock loop (PLL) 96, which includes a fractional-N divider 98, a phase detector 100, a loop filter 102, a voltage controlled oscillator (VCO) 104, and a mixer 106. The FN-OPLL 90 also includes a second PLL 108. It should be noted that the second PLL 108 may also be used as the frequency synthesizer 26 (FIG. 1) for the mobile terminal 10 when in receive mode. In operation, the fractional-N divider 98 fractionally divides a local oscillator frequency signal ($F_{LO2}$), which is the output of the second PLL 108 and a reference frequency ($F_{R1}$) for the first PLL 96, based on an integer value ($N_{INT1}$) and a fractional value (NUM1) to provide the reference signal ($F_{R1}'$).

The values $N_{INT1}$ and NUM1 are generated by combiner circuitry 110 based on a modulation signal, which in this embodiment corresponds to the pre-distorted frequency signal (f'') from the phase path of the modulator 36 of FIG. 2, and integer and fractional values $N_{INT0}$ and NUM0. The integer and fractional values $N_{INT0}$ and NUM0 define an initial fractional divide value ($N_0$), which corresponds to a desired center or carrier frequency of the output signal ($F_{VCO}$). The integer and fractional values $N_{INT0}$ and NUM0 may be provided by the control system 22 (FIG. 1).

In one embodiment, the combiner circuitry 110 combines the initial fractional divide value ($N_0$) and the pre-distorted frequency signal (f'') using the following equation:

$$N = N_0 + \text{Modulation, where}$$

$$N = N_{INT1} \cdot \text{NUM1, and}$$

N is a combined divider value and "Modulation" is the pre-distorted frequency signal (f''). The value $N_{INT1}$ is an integer portion of the combined divider value and NUM1 is a fractional part of the combined divider value.

The value $N_{INT1}$ is passed to delay circuitry 112 which delays the value $N_{INT1}$ with a delay equal to the effective delay of delta-sigma modulator 116, creating a delayed version of the value $N_{INT1}$ ($N'_{INT1}$). As discussed below, the delay ensures that the value $N'_{INT1}$ and a sequence output by the delta-sigma modulator 116 are time aligned at a summation node of the fractional-N divider 98.

An exemplary embodiment of the fractional-N divider 98 is also illustrated in FIG. 3, wherein the fractional-N divider 98 includes N-divider circuitry 114, delta-sigma modulator 116, and summation circuitry 118. The summation circuitry 118 is generally referred to as combiner circuitry, and can comprise, for example, a digital binary adder. The operation of the fractional-N divider 98 is known in the art and is not described in detail herein. In general, the fractional-N divider 98 divides the local oscillator signal ($F_{LO2}$), or reference signal, by $N'_{INT1}$·NUM1, where N'INT1 is the delayed version of the integer portion ($N_{INT1}$) of the combined divide value from the combiner circuitry 110 and NUM1 is the fractional portion of the combined divide value from the combiner circuitry 110. The delay circuitry 112 ensures that the delayed version of the value $N_{INT1}$ ($N'_{INT1}$) and the sequence output by the delta-sigma modulator 116 are time aligned at the summation circuitry 118. Accordingly, an instantaneous divide value ($N_{INST}$) provided to the N-divider circuitry 114 from the summation circuitry 118 is defined as:

$N_{INST} = N'_{INT1} + \text{sequence}$, where $N'_{INT1}$ is the output of the delay circuitry 112, and sequence is a current value of a sequence provided by the delta-sigma modulator 116, as will be apparent to one of ordinary skill in the art.

Since the fractional divide value ($N'_{INT1}$·NUM1) of the fractional-N divider 98 is provided by the combiner circuitry 110 based on the pre-distorted frequency signal (f"), the local oscillator signal ($F_{LO}$) is fractionally divided based on the pre-distorted frequency signal (f"), thereby controlling the output signal ($F_{VCO}$) of the FN-OPLL 90 such that it is a phase or frequency modulated signal. Further, in one embodiment, the pre-distorted frequency signal (f") is a digital signal such that the FN-OPLL 90 provides a digital modulation interface. This is especially beneficial where the phase path of the modulator 36 (FIG. 2) from the data interface 52 (FIG. 2) to the FN-OPLL 90 is entirely a digital path according to one embodiment of the present invention.

The phase detector 100 compares the fractionally divided reference signal ($F_{R1}'$) output by the fractional-N divider 98 to an intermediate frequency signal ($F_{IF}$). Note that the phase detector 100 may include a charge pump, as will be apparent to one having ordinary skill in the art. The output of the phase detector 100 is filtered by the loop filter 102 and provided to the VCO 104 as a control voltage ($V_C$). The loop filter 102 is designed such that the first PLL 96 has a wide open-loop unity-gain bandwidth. In one embodiment, the first PLL 96 has a bandwidth in the range of 800 kHz to 1.2 MHz. The wide bandwidth is possible, at least in part, due to the use of the mixer 106 in the feedback path rather than a fractional-N divider as in traditional fractional-N PLLs. Based on the control voltage ($V_C$), the VCO 104 provides the output signal ($F_{VCO}$). As described above with respect to the modulator 36, the output of the VCO 104 is the modulated signal and is provided to the power amplifier circuitry 38.

The output signal ($F_{VCO}$) of the VCO 104 is also provided to a feedback path including the mixer 106 and optionally a feedback filter 120. The mixer 106 operates to multiply the output signal ($F_{VCO}$) of the VCO 104 by the local oscillator signal ($F_{LO2}$). It should be noted that divider circuits may be placed between the VCO 104 and the mixer 106 depending on the particular implementation. The local oscillator signal ($F_{LO2}$) is provided by a divider 122, which operates to divide a local oscillator signal ($F_{LO}$) provided by a voltage controlled oscillator 128 of the second PLL 108 by an integer divide value. In one embodiment, the integer divide value may be selected as either 1 or 2. The divider 122 may alternatively be a fractional-N divider. It should be noted that the divider 122 is optional, and the local oscillator signal ($F_{LO}$) may alternatively be provided to the mixer 106.

In operation, the mixer 106 multiplies the output signal ($F_{VCO}$) of the VCO 104 and the local oscillator signal ($F_{LO2}$), thereby downconverting the output signal ($F_{VCO}$) to provide the intermediate frequency signal ($F_{IF}$). The output of the mixer 106 may include a high frequency component at a frequency equal to the frequency of the signal ($F_{VCO}$) plus the frequency of the local oscillator signal ($F_{LO2}$) and a low frequency component at a frequency equal to a difference of the frequency of the signal ($F_{VCO}$) and the frequency of the local oscillator signal ($F_{LO2}$), as commonly known. Thus, the output of the mixer 106 may optionally be filtered by the feedback filter 120 to remove either the high frequency component or the low frequency component depending on the particular implantation to thereby provide the intermediate frequency signal ($F_{IF}$) to the phase detector 100.

An exemplary embodiment of the second PLL 108 is also illustrated in FIG. 3. In this embodiment, the second PLL 108 is a fractional-N PLL and includes a phase detector 124, a loop filter 126, the voltage controlled oscillator 128, a fractional-N divider 130, and the divider 122. In operation, the voltage controlled oscillator 128 provides the local oscillator signal ($F_{LO}$). The local oscillator signal ($F_{LO}$) is fractionally divided by the fractional-N divider 130 to provide a feedback signal to one input of the phase detector 124. A reference frequency ($F_{R2}$), which may be generated by a reference oscillator, is provided to a second input of the phase detector 124. The phase detector 124 compares the feedback signal to the reference frequency ($F_{R2}$) and an output signal from the phase detector 124 is provided to the loop filter 126. The loop filter 126 filters the output signal from the phase detector 124 to provide a control voltage to the voltage controlled oscillator 128. In one embodiment, the loop filter 126 has a narrow bandwidth, such as 90 kHz. The frequency of the local oscillator signal ($F_{LO}$) is controlled by an external component, such as the control system 22 (FIG. 1), by controlling the control inputs ($N_{INT2}$ and NUM2) provided to the fractional-N divider 130. Accordingly, the control inputs $N_{INT2}$ and NUM2 may be controlled for channel selection and for spur avoidance.

Figure 4:
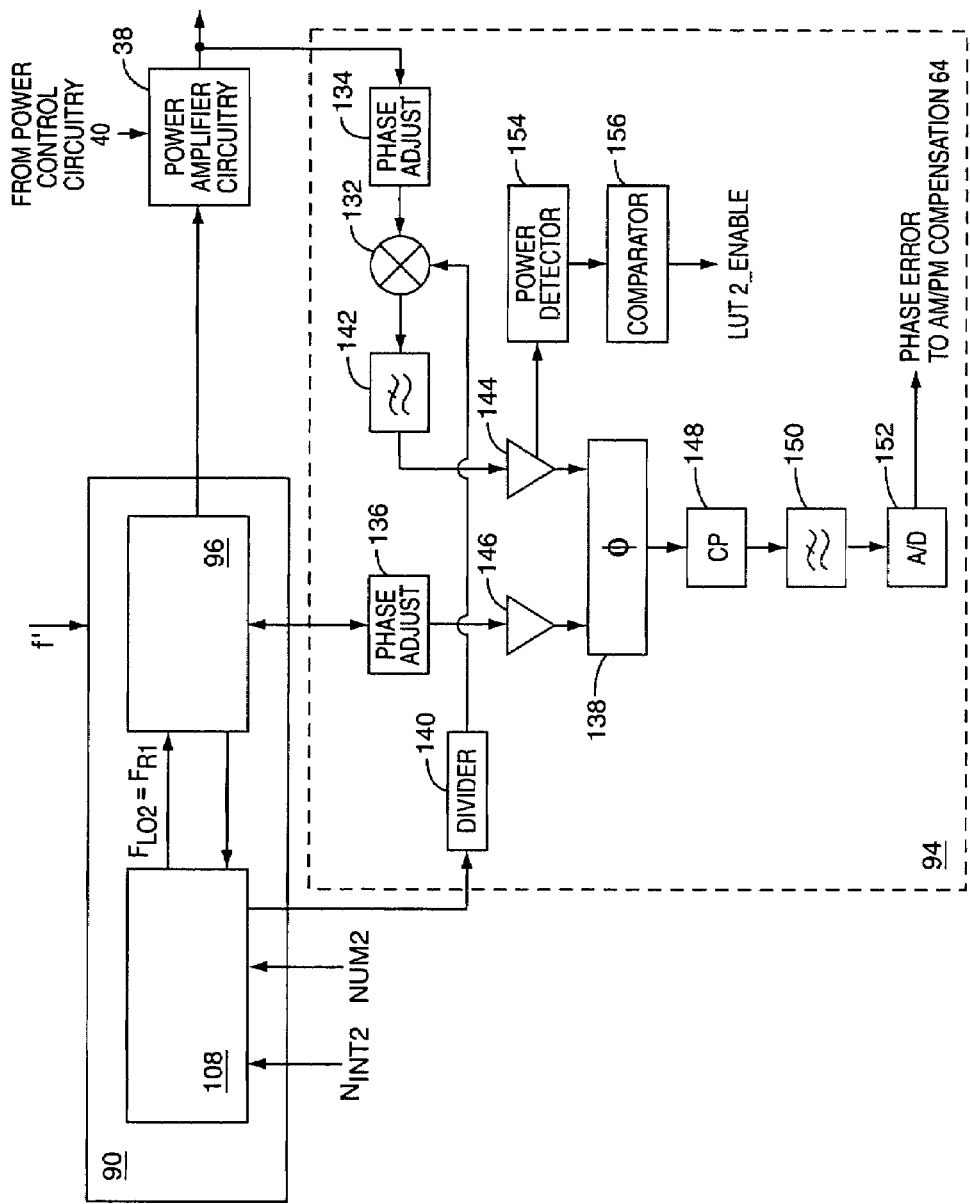
FIG. 4 illustrates the phase error detection circuitry of FIG. 3 according to one embodiment of the present invention.

FIG. 4 illustrates the phase error detection circuitry 94 of FIG. 3 according to one embodiment of the present invention. In general, the phase error detection circuitry 94 operates to compare a phase of a downconverted version of the radio frequency (RF) output signal of the power amplifier circuitry 38 to a phase of a downconverted version of the input of the power amplifier circuitry 38 during ramp-up for a transmit burst to provide phase error measurements. The phase error measurements correspond to the AM/PM distortion characteristic of the power amplifier circuitry 38 for the select frequency band, sub-band, and high or low power setting under the load conditions present at the power amplifier output and ambient temperature.

More specifically, the output of the power amplifier circuitry 38 is coupled to a first input of mixing circuitry 132 via optional phase adjust circuitry 134. The phase adjust circuitry 134, as well as phase adjust circuitry 136, may apply a phase adjustment to the corresponding signals such that phase detector 138 operates within its linear region. A second input of the mixing circuitry 132 is coupled to the output of the VCO 128 via divider 140. The divide value of the divider 140 is essentially equal to the divide value of the divider 122 (FIG. 3). As such, the signal provided to the second input of the mixing circuitry 132 has a frequency equal to $F_{LO2}$. It should be noted that the divider 140 is optional in that the second input of the mixing circuitry 132 may alternatively be coupled to the output of the divider 122. The two separate dividers 122 and 140 are preferred such that the noise performance of the dividers 122 and 140 may be optimized separately to provide improved performance.

At the mixing circuitry 132, the signal from the divider 140 and the RF output signal are combined to provide output signals at frequencies $F_{RF} \pm F_{LO2}$, where $F_{RF}$ is the frequency of the RF output signal. Filtering circuitry 142, which in this embodiment is a low-pass filter, operates to low-pass filter the output of the mixing circuitry 132 to provide a downconverted power amplifier (PA) output signal at a frequency essentially equally to $F_{RF} - F_{LO2}$. The downconverted PA output signal is then passed to a limiter 144. The limiter 144 operates to remove the amplitude modulation component from the downconverted PA output signal before providing the downconverted output signal to a first input of the phase detector 138. Thus, the downconverted PA output signal provided to the first input of the phase detector 138 has essentially a constant amplitude and varying phase.

In a similar fashion, an amplitude limited, downconverted version of the input of the power amplifier circuitry 38, which is the output of the VCO 104, is provided to a second input of the phase detector 138. Since the mixer 106 and feedback filter 120 in the feedback path of the PLL 96 already downconvert the output of the VCO 104 to an IF signal at a frequency essentially equal to $F_{RF} - F_{LO2}$, no additional circuitry is needed to provide the downconverted PA input signal to the input of the phase adjust circuitry 136. As discussed above, the phase adjust circuitry 136 is optional and may be desired to ensure that the phase detector 138 operates in its linear region for improved performance. The downconverted PA input signal provided from the phase adjust circuitry 136 is then passed to a limiter 146 before providing the downconverted PA input signal to the second input of the phase detector 138. The limiter 146 is optional, but is preferably included such that the path for the downconverted PA input signal is like that of the path for the downconverted PA output signal, thereby ensuring that the two signals are time-aligned when received by the phase detector 138. In addition, the limiter 146 operates to remove any amplitude modulation component from the downconverted PA input signal. Note that a small amplitude modulation component may exist in the downconverted PA input signal due to variations in an input impedance of the power amplifier circuitry 38 as a result of the varying supply voltage provided to the power amplifier circuitry 38.

At the inputs of the phase detector 138, the downconverted PA input and output signal are both at a frequency essentially equal to $F_{RF} - F_{LO2}$. Note that by coupling the input and output of the power amplifier circuitry 38 to the inputs of the phase detector 138, any phase noise in the output of the VCO 104 (FIG. 3) is cancelled. As such, an averaging scheme is not needed to remove the phase noise from the VCO 104, thereby substantially decreasing the amount of time needed to measure the phase error between the input and output of the power amplifier circuitry 38.

As will be apparent to one of ordinary skill in the art upon reading this disclosure, the phase detector 138 operates to provide an output signal having a duty cycle corresponding to a phase error between the downconverted PA output signal and the downconverted PA input signal. The output of the phase detector 138 is analog converted by a charge pump 148 and then low-pass filtered by filtering circuitry 150 to provide an analog phase error signal. An analog-to-digital (A/D) converter 152 samples the analog phase error signal at a desired sampling rate to provide digital phase error measurements (PHASE ERROR). The phase error measurements (PHASE ERROR) may be provided continuously while the radio frequency transmitter section 14 (FIG. 1) is enabled or enabled only when desired to provide the phase error measurements.

The limiter 144 may also be used to provide a power detection signal to a power detector 154. While the details of the limiter 144 are not necessary for the understanding of the present invention, the limiter 144 may be implemented by cascading a number of low-gain AC coupled differential amplifiers. The differential amplifiers may be implemented using the tripler cell disclosed in U.S. Pat. No. 4,620,144, entitled SIGNAL STRENGTH DETECTOR, which issued on Oct. 28, 1986 and is hereby incorporated by reference in its entirety. In a classical implementation, the three Field Effect Transistors (FETs) in the tripler cell all have the same DC current flowing through their drains. As a medium strength AC signal is applied to the tripler cell, the central FET starts to be starved of current with all the current flowing in the outer FETs. As the input signal becomes larger and perhaps becoming a square wave signal, the current in the central FET almost falls to zero. Thus, the power detection signal may be generated by summing the outputs of the central FETs in each of the tripler cells. For very small input signals, the current in the central FETs are all at a maximum. For medium level signals, the current in some of the central FETs will be large while the current for others of the central FETs will be small. For large input signals, all of the central FETs will have low current. Thus, the sum of the currents from the central FETs in all of the tripler cells provides an output current that is inversely proportional to the log of the amplitude of the input signal, thereby providing the power detection signal that is inversely proportional to the input power at the input of the limiter 144.

As described below, prior to ramp-up after the FN-OPLL 90 has settled and while power amplifier circuitry 38 is disabled, the power detector 154 operates to detect a power level of external interferers seen at the output of the power amplifier circuitry 38, which is coupled to the antenna 16 (FIG. 1). A comparator 156 compares the detected power level to a threshold to determine if a strong interferer is present at the antenna 16. If a strong interferer is present, the phase error measurements made during ramp-up for the upcoming transmit burst may be disregarded. In addition, or alternatively, the power level of any interferers may be detected after ramp-down at the end of the transmit burst when the power amplifier circuitry 38 is disabled and the FN-OPLL 90 is locked. In this manner, the present invention ensures that the AM/PM compensation provided by the AM/PM compensation circuitry 64 (FIG. 2) is not corrupted by phase error measurements made when a strong interferer is present at the antenna 16 of the mobile terminal 10.

In addition or alternatively, a strong interferer may be detected based on the phase error measurements made during ramp-up and/or phase error measurements made during ramp-down for a previous transmit burst. In one embodiment, a peak phase error measurement is determined. If the peak, or maximum, phase error measurement is greater than a predetermined threshold, then it is determined that a strong interferer was present when the phase error measurements were obtained. In another embodiment, a Root Mean Squared (RMS) phase error value is computed from the phase error measurements. If the RMS phase error is greater than a predetermined threshold, then it is determined that a strong interferer was present when the phase error measurements were obtained. If a strong interferer is detected, then seed AM/PM compensation values rather than the phase error measurements are used to provide AM/PM compensation, as discussed below in more detail.

Figure 5:
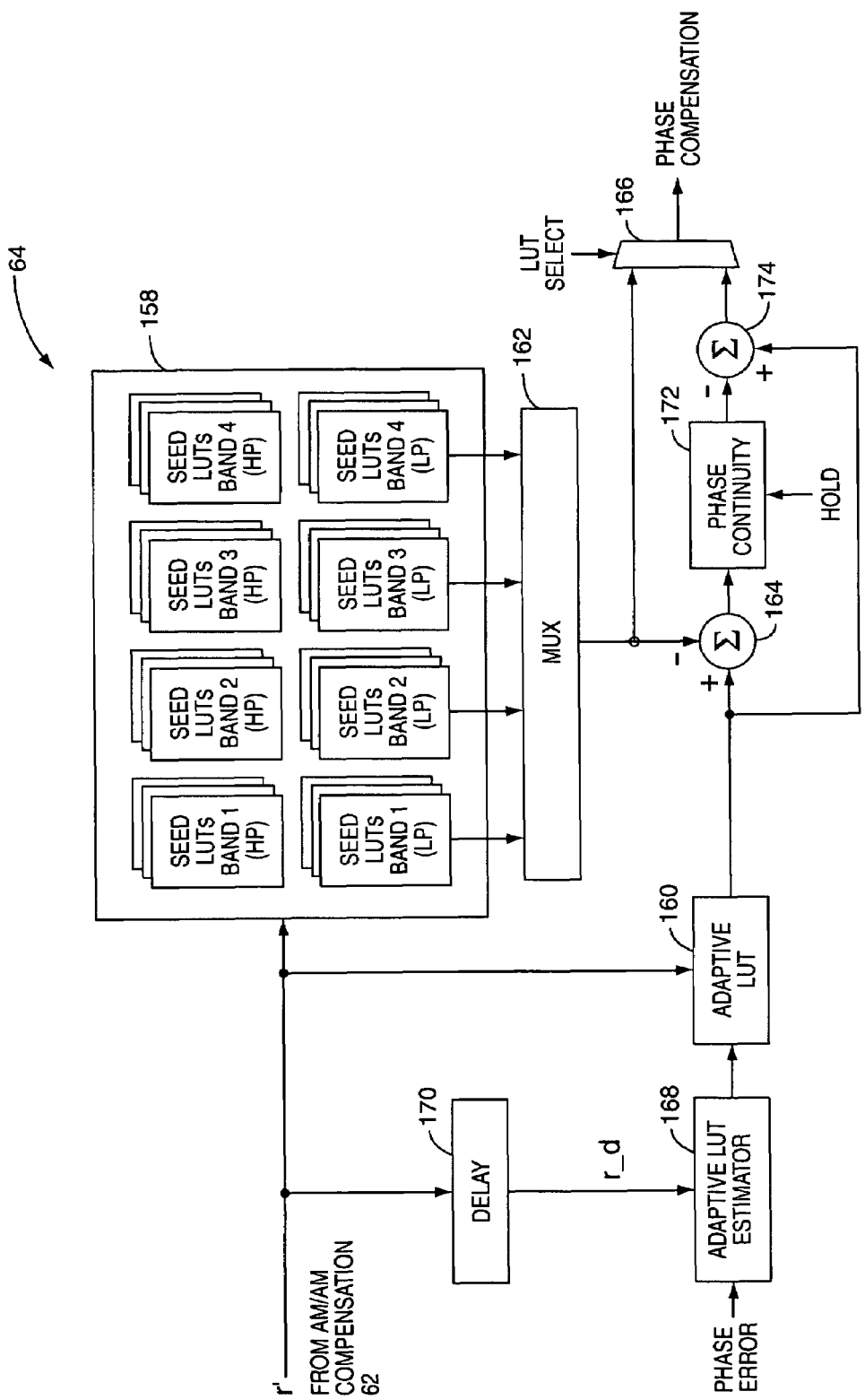
FIG. 5 illustrates the Amplitude Modulation to Phase Modulation (AM/PM) compensation circuitry of FIG. 2 according to one embodiment of the present invention.

FIG. 5 is a detailed block diagram of the AM/PM compensation circuitry 64 according to one embodiment of the present invention. In general, the AM/PM compensation circuitry 64 includes seed look-up tables (LUTs) 158 and an adaptive LUT 160. The seed LUTs 158 are calibrated under ideal temperature and load conditions in a factory calibration process such as, but not limited to, the calibration process disclosed in commonly owned and assigned U.S. patent application Ser. No. 11/347,957, entitled FAST CALIBRATION OF AM/PM PRE-DISTORTION, filed Feb. 6, 2006, which is hereby incorporated by reference in its entirety. In this embodiment, the seed LUTs 158 include a seed LUT for each frequency band and sub-band combination for each of a high power setting and a low power setting of the power amplifier circuitry 38. For a GSM system, there are four frequency bands, each having three sub-bands. Thus, there are 12 seed LUTs for each of the high power setting and the low power setting for a total of 24 seed LUTs. The adaptive LUT 160 is calibrated for each transmit burst based on the phase error measurements obtained during ramp-up for the transmit burst.

In operation, for a given transmit burst, a multiplexer 162 is controlled to couple an output of a select one of the seed LUTs 158 to the input of combiner circuitry 164 and switch 166. The select one of the seed LUTS 158 is the one of the seed LUTs 158 corresponding to the desired frequency band, sub-band, and high or low power setting for the transmit burst. During ramp-up for the transmit burst, the pre-distorted amplitude signal (r') is provided to the seed LUTs 158 from the AM/AM compensation circuitry 62. Based on the pre-distorted amplitude signal (r'), the seed LUTs 158 provide phase compensation values. The multiplexer 162 provides the phase compensation value from the select one of the seed LUTs 158 to the switch 166. The switch 166 is controlled to output the phase compensation value from the seed LUTs 158 as the phase compensation value.

The measurements of the phase error between the input of the power amplifier circuitry 38 and the output of the power amplifier circuitry 38 are obtained from the phase error detection circuitry 94 during ramp-up and provided to adaptive LUT estimator 168. The adaptive LUT estimator 168 also receives a delayed version of the pre-distorted amplitude signal (r') from delay circuitry 170. The delay circuitry 170 operates to delay the pre-distorted amplitude signal (r') such that the delayed version of the pre-distorted amplitude signal (r') is essentially time-aligned with the phase error measurements. Using the phase error measurements and the delayed pre-distorted amplitude signal (r'), the adaptive LUT estimator 168 calibrates the adaptive LUT 160 to compensate for the AM/PM distortion of the power amplifier circuitry 38 for the same transmit burst.

Once ramp-up is complete and the adaptive LUT 160 is calibrated, the switch 166 is controlled such that the AM/PM compensation circuitry 64 switches from the seed LUTs 158 to the adaptive LUT 160 for the rest of the transmit burst. However, in order to maintain phase continuity when switching from the seed LUTs 158 to the adaptive LUT 160, the combiner circuitry 164, phase continuity register 172, and combiner circuitry 174 operate to determine a phase offset between a phase compensation value provided from the seed LUTs 158 via the multiplexer 162 and a phase compensation value provided by the adaptive LUT 160 at the time the switch from the seed LUTs 158 to the adaptive LUT 160 is made and apply the phase offset to the output of the adaptive LUT 160. More specifically, when the switch between the seed LUTs 158 and the adaptive LUT 160 is made, the combiner circuitry 164 operates to determine a phase offset, or difference, between the phase compensation value provided from the seed LUTs 158 and the phase compensation value provided by the adaptive LUT 160. The phase offset is provided to the phase continuity register 172. The phase continuity register 172 provides the phase offset to the combiner circuitry 174 during the transmit burst, wherein the combiner circuitry 174 subtracts the phase offset from the phase compensation values from the adaptive LUT 160 to provide output phase compensation values. As a result, phase continuity is maintained when switching from the seed LUTs 158 to the adaptive LUT 160.

Figure 6:
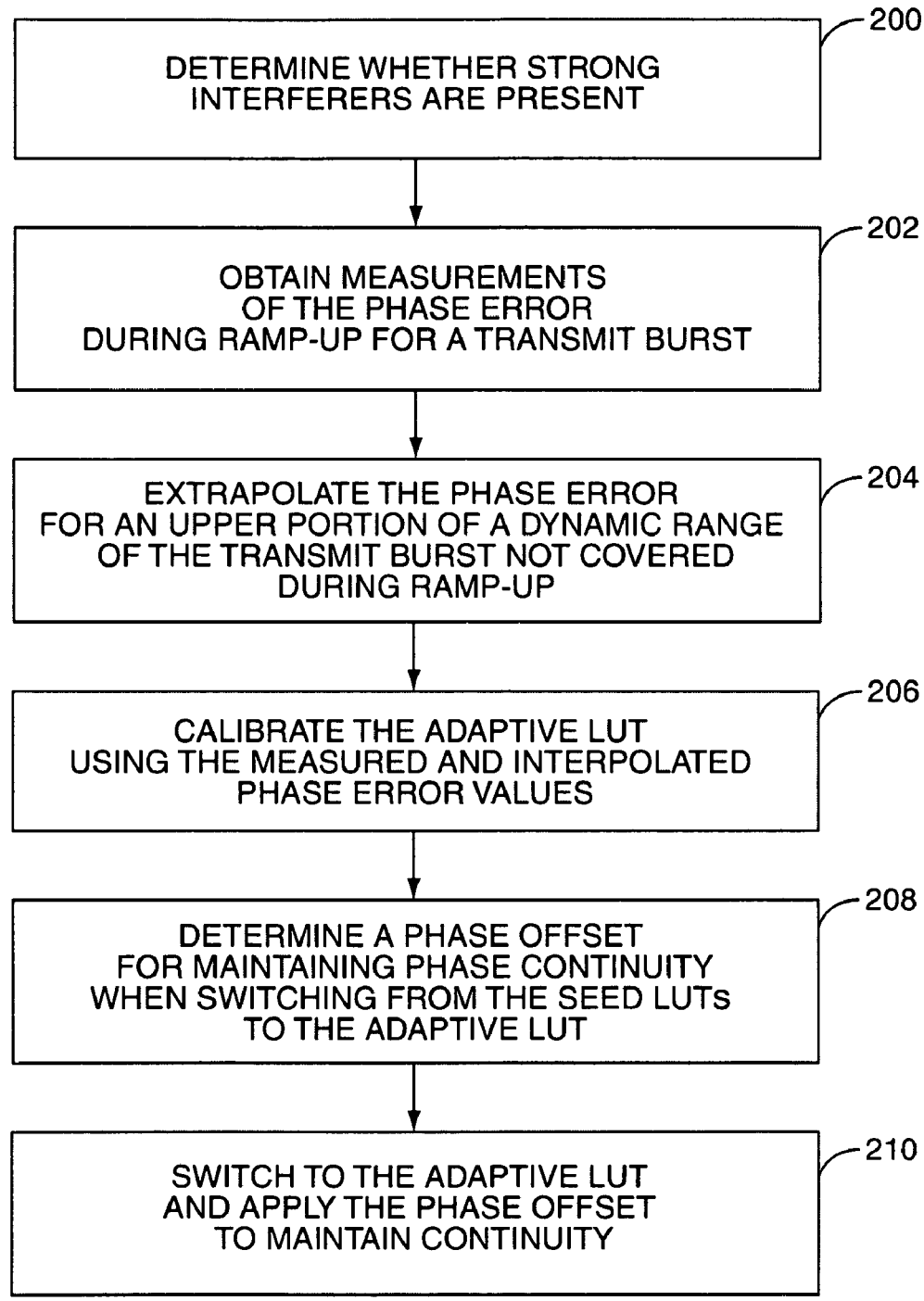
FIG. 6 illustrates a process for calibrating the AM/PM compensation circuitry of FIG. 4 for a transmit burst based on phase error measurements obtained during ramp-up for the transmit burst according to one embodiment of the present invention.

FIG. 6 illustrates the operation of the AM/PM compensation circuitry 64 according to one embodiment of the present invention. First, a determination is made as to whether a strong interferer is present at the antenna 16 (step 200). As discussed above with respect to FIG. 3, the limiter 144, power detector 154, and comparator 156 may be used to determine whether a power level of any interferers present at the antenna 16 exceed a predetermined threshold. In one embodiment, this power detection process is performed after the FN-OPLL 90 has locked to the desired frequency for an upcoming transmit burst but prior to beginning ramp-up when the power amplifier circuitry 38 is disabled. As such, the power amplifier circuitry 38 is not yet providing an output signal, and the power levels of any interferers present at the output of the power amplifier circuitry 38 can be detected. In addition or alternatively, a strong interferer may be detected based on phase error measurements made during ramp-down for the previous transmit burst. Still further, a strong interferer may be detected after ramp-up using the phase error measurements obtained during ramp-up, as discussed above with respect to FIG. 3.

If a strong interferer is present, the AM/PM compensation circuitry 64 may not switch to the adaptive LUT 160. Instead, the seed LUTs 158 may be used for the entire transmit burst. Further, the phase error detection circuitry 94 may be disabled by, for example, disabling a clock signal provided to the A/D converter 152 or the phase measurements may be ignored.

Assuming that no strong interferers are detected in step 200, the AM/PM compensation circuitry 64 obtains measurements of the phase error between the input of the power amplifier circuitry 38 and the output of the power amplifier circuitry 38 from the phase error detection circuitry 94 during ramp-up for a transmit burst (step 202). One issue is that for the EDGE standard, ramp-up does not cover the entire dynamic range to be covered during the transmit burst. More specifically, at the end of ramp-up, the pre-distorted amplitude signal (r') is about 1.3 dB below a peak amplitude of the transmit burst. The peak amplitude occurs due to the amplitude modulation component of the transmitted signal. In order to obtain phase error estimates for the upper portion of the dynamic range, the AM/PM compensation circuitry 64, and specifically the adaptive LUT estimator 168, extrapolates a number of phase error values for the upper portion of the dynamic range not covered during ramp-up (step 204). The extrapolation is performed using the phase error measurements obtained during ramp-up.

The extrapolation of the phase errors for the upper portion of the dynamic range of the transmit burst is illustrated in FIG. 7. As illustrated, a number of phase error measurements are obtained during ramp-up. These phase error measurements correspond to values r_d(1)–r_d(L) of the delayed version of the pre-distorted amplitude signal (r') (FIG. 4). At the end of ramp-up, the amplitude signal (r_d) is approximately 1.3 dB below a peak amplitude to occur during the transmit burst. In order to estimate phase error values for the upper portion of the dynamic range not covered during ramp-up, the adaptive LUT estimator 168 extrapolates phase error values for the upper portion of the dynamic range based on the phase error measurements obtained during ramp-up. The extrapolation may be a linear extrapolation based on two or more of the last phase error measurements made at the end of ramp-up.

Returning to FIG. 6, once the phase error measurements are obtained and the extrapolation is performed, the adaptive LUT estimator 168 then calibrates the adaptive LUT 160 based on the measured and extrapolated phase error values (step 206). In one embodiment, the measured and extrapolated phase error values may be stored in the adaptive LUT 160 in association with the corresponding amplitude signal values or in memory locations associated with corresponding amplitude signal values. In another embodiment, phase errors may be desired for particular values of the pre-distorted amplitude signal (r'). Further, depending on the particular implementation, the measurements of the phase error may not correspond to the desired values of the pre-distorted amplitude signal (r'). Thus, the adaptive LUT estimator 168 may perform interpolations using the measured phase error values to determine estimates of the phase error values for the desired values of the pre-distorted amplitude signal (r'). This is illustrated in FIG. 8. As shown, phase error measurements may be obtained during ramp-up for values of the delayed amplitude signal r_d(1) through r_d(K). However, it is desired to calibrate the adaptive LUT 160 using phase error values corresponding to amplitude values VLUT2(min) through amplitude VLUT2(max). As such, the adaptive LUT estimator 168 performs a number of interpolations to determine the desired phase error values. For example, a first phase error value may be desired for the amplitude value VLUT2 (min). In order to determine this first phase error value, a linear interpolation may be performed using the phase error values for the amplitude values r_d(1) and r_d(2). In a similar fashion, interpolations may be performed to determine each of the desired phase error values.

Again returning to FIG. 6, once the adaptive LUT 160 is calibrated, the phase offset is determined for maintaining phase continuity when switching between the seed LUTs 158 and the adaptive LUT 160 (step 208). As discussed above, the phase offset is the difference between the phase compensation value provided by the seed LUTs 158 and the phase value provided by the adaptive LUT 160 at the time at which the AM/PM compensation circuitry 64 switches from the seed LUTs 158 to the adaptive LUT 160. The AM/PM compensation circuitry 64 switches to the adaptive LUT 160 and applies the phase offset to the output of the adaptive LUT 160 to maintain continuity and provide AM/PM compensation for the rest of the transmit burst (step 210). However, note that if a strong interferer is detected based on the phase error measurements made during ramp-up, the AM/PM compensation circuitry 64 may continue to provide AM/PM compensation using the seed LUTs 158 until a strong interferer is no longer detected. The process is repeated for each transmit burst.

It should be noted that the phase error detection circuitry 94 and the AM/PM compensation circuitry 64 of the present invention provide substantial benefits over a closed loop system wherein the power amplifier circuitry 38 is within the feedback loop of the frequency synthesizer, such as the FN-OPLL 90. While the closed loop system compensates for the AM/PM distortion of the power amplifier circuitry 38 by placing the power amplifier circuitry 38 within the feedback loop of the frequency synthesizer, an interferer at the antenna could cause the frequency synthesizer to unlock. As a result, the mobile terminal 10 will likely fail both in-band and out-of-band spectrum requirements. In contrast, even without strong interferer detection, the worst case scenario for the present invention is that the adaptive LUT 160 may become corrupted, thereby resulting only in a failure of in-band spectrum requirements. Because the feedback path of the FN-OPLL 90 is not coupled to the power amplifier output, the FN-OPLL 90 will not become unlocked due to a strong interferer. As such, the mobile terminal 10 of the present invention will not fail out-of-band spectrum requirements even in the presence of strong interferers. This is a substantial benefit over the closed loop system.

The present invention provides substantial opportunity for variation without departing from the spirit or scope of the present invention. For example, while the seed LUTs 158 and the adaptive LUT 160 are discussed above, the present invention is not limited thereto. Other types of seed compensation circuitry and adaptive compensation circuitry may be used. For instance, the AM/PM compensation circuitry 64 may alternatively operate to provide pre-distortion based on Nth order polynomials. An exemplary polynomial pre-distortion system is disclosed in commonly owned and assigned U.S. patent application Ser. No. 10/874,509, entitled MULTIPLE POLYNOMIAL DIGITAL PREDISTORTION, filed Jun. 23, 2004, which is hereby incorporated by reference in its entirety. If polynomial pre-distortion were used, seed coefficients defining seed polynomials may be calibrated using a factor calibration process under ideal load conditions. The phase error measurements obtained during ramp-up may be used to generate coefficients defining an adaptive polynomial. The adaptive polynomial may then be used to provide AM/PM compensation for the remainder of the transmit burst.

Those skilled in the art will recognize improvements and modifications to the preferred embodiments of the present invention. All such improvements and modifications are considered within the scope of the concepts disclosed herein and the claims that follow.

What is claimed is:

1. A method for calibrating Amplitude Modulation to Phase Modulation (AM/PM) compensation in a transmitter operating according to a polar modulation scheme comprising:

obtaining during ramp-up for a transmit burst phase error measurements of a phase error between a phase of an input signal provided to an input of power amplifier circuitry of the transmitter and a phase of an output signal provided at an output of the power amplifier circuitry;

pre-distorting the input signal to provide AM/PM compensation during ramp-up for the transmit burst using seed compensation circuitry calibrated for ideal load conditions; and providing AM/PM compensation for the transmit burst based on the phase error measurements by calibrating adaptive compensation circuitry based on the phase error measurements and pre-distorting the input signal to provide AM/PM compensation for at least a portion of the transmit burst after ramp-up using the adaptive compensation circuitry.

2. The method of claim 1 further comprising repeating the steps of obtaining and providing for each of a plurality of transmit bursts.

3. The method of claim 1 wherein providing AM/PM compensation comprises applying AM/PM compensation to the input signal during the transmit burst based on the phase error measurements.

4. The method of claim 1 wherein pre-distorting the input signal to provide AM/PM compensation for at least a portion of the transmit burst after ramp-up comprises switching from the seed compensation circuitry to the adaptive compensation circuitry.

5. The method of claim 4 wherein pre-distorting the input signal to provide AM/PM compensation for at least a portion of the transmit burst after ramp-up further comprises:
 determining a phase offset between a phase compensation value output by the seed compensation circuitry and a phase compensation value output by the adaptive compensation circuitry at a time of switching from the seed compensation circuitry to the adaptive compensation circuitry; and
 applying the phase offset to the output of the adaptive compensation circuitry to maintain phase continuity.

6. The method of claim 1 wherein an upper portion of a desired dynamic range of the power amplifier circuitry for the transmit burst is not covered during ramp-up for the transmit burst, and the method further comprises:
 generating phase error estimates for the upper portion of the desired dynamic range based on the phase error measurements; and
 providing the AM/PM compensation for the transmit burst based on the phase error measurements and the phase error estimates.

7. The method of claim 1 wherein providing the AM/PM compensation for the transmit burst comprises interpolating a plurality of desired phase error values based on the phase error measurements, and providing AM/PM compensation based on the desired phase error values.

8. The method of claim 1 further comprising:
 detecting a power level of an interferer signal present at an antenna of the transmitter prior to ramp-up; and
 providing AM/PM compensation for the transmit burst based on seed compensation values rather than the phase error measurements if the power level of the interferer signal is above a predetermined threshold, wherein the seed compensation values are pre-determined based on ideal load conditions.

9. The method of claim 8 wherein detecting the power level of the interferer signal comprises detecting the power level of the interferer signal after ramp-down for a previous transmit burst when the power amplifier circuitry is disabled and an associated frequency synthesizer is stable, and detecting the power level of the interferer signal prior to ramp-up for the transmit burst when the power amplifier circuitry is disabled and the associated frequency synthesizer is stable.

10. The method of claim 1 further comprising:
 determining whether a strong interferer signal is present at an antenna of the transmitter based on phase error measurements of the phase error between the phase of the input signal provided to the input of the power amplifier circuitry and the phase of the output signal provided at the output of the power amplifier circuitry during ramp-down for a previous transmit burst; and
 providing AM/PM compensation for the transmit burst based on seed compensation values rather than the phase error measurements if the strong interferer signal is present at the antenna, wherein the seed compensation values are pre-determined based on ideal load conditions.

11. The method of claim 1 wherein obtaining the phase error measurements during ramp-up for the transmit burst comprises:
 downconverting the output signal of the power amplifier circuitry to a desired frequency to provide a downconverted power amplifier output signal;
 downconverting the input signal of the power amplifier circuitry to the desired frequency to provide a downconverted power amplifier input signal; and
 obtaining the phase error measurements based on a phase error between a phase of the downconverted power amplifier output signal and a phase of the downconverted power amplifier input signal.

12. A method for calibrating Amplitude Modulation to Phase Modulation (AM/PM) compensation in a transmitter operating according to a polar modulation scheme comprising:
 obtaining during ramp-up for a transmit burst phase error measurements of a phase error between a phase of an input signal provided to an input of power amplifier circuitry of the transmitter and a phase of an output signal provided at an output of the power amplifier circuitry;
 providing AM/PM compensation for the transmit burst based on the phase error measurements;
 determining whether a strong interferer signal is present at an antenna of the transmitter based on the phase error measurements; and
 providing AM/PM compensation for the transmit burst based on seed compensation values rather than the phase error measurements if the strong interferer signal is present at the antenna, wherein the seed compensation values are pre-determined based on ideal load conditions.

13. A system for calibrating Amplitude Modulation to Phase Modulation (AM/PM) compensation in a transmitter operating according to a polar modulation scheme comprising:
 phase error detection circuitry adapted to obtain during ramp-up for a transmit burst phase error measurements of a phase error between a phase of an input signal provided to an input of power amplifier circuitry of the transmitter and a phase of an output signal provided at an output of the power amplifier circuitry; and
 AM/PM compensation circuitry;
 comprising:
  seed compensation circuitry calibrated based on ideal load conditions and adapted to compensate the input signal during ramp-up for the transmit burst;
  adaptive compensation circuitry calibrated based on the phase error measurements and adapted to compensate the input signal for at least a portion of the transmit burst after ramp-up based on the adaptive compensation circuitry; and
  adaptive compensation estimation circuitry adapted to calibrate the adaptive compensation circuitry based on the phase error measurements; and
  adapted to provide AM/PM compensation for the transmit burst based on the phase error measurements.

14. The system of claim 13 wherein the phase error detection circuitry is further adapted to obtain second phase error measurements during ramp-up for a second transmit burst, and the AM/PM compensation circuitry is further adapted to provide AM/PM compensation for the second transmit burst based on the second phase error measurements.

15. The system of claim 13 wherein the AM/PM compensation circuitry is further adapted to provide AM/PM compensation by applying the AM/PM compensation to the input signal during the transmit burst based on the phase error measurements.

16. The system of claim 13 wherein the AM/PM compensation circuitry is further adapted to switch from the seed compensation circuitry to the adaptive compensation circuitry after ramp-up and calibration of the adaptive compensation circuitry.

17. The system of claim 16 wherein the AM/PM compensation circuitry is further adapted to:
determine a phase offset between a phase compensation value output by the seed compensation circuitry and a phase compensation value output by the adaptive compensation circuitry at a time at which the AM/PM compensation circuitry switches from the seed compensation circuitry to the adaptive compensation circuitry; and
apply the phase offset to phase compensation values including the phase compensation value output by the adaptive compensation circuitry to maintain phase continuity.

18. The system of claim 13 wherein an upper portion of a desired dynamic range of the power amplifier circuitry for the transmit burst is not covered during ramp-up for the transmit burst, and the AM/PM compensation circuitry is further adapted to:
determine phase error estimates for the upper portion of the desired dynamic range based on the phase error measurements; and
provide AM/PM compensation for the transmit burst based on the phase error measurements and the phase error estimates.

19. The system of claim 13 wherein the AM/PM compensation circuitry is further adapted to:
interpolate a plurality of desired phase error values based on the phase error measurements; and
provide the AM/PM compensation based on the desired phase error values.

20. The system of claim 13 wherein the phase error detection circuitry comprises a first input coupled to the output of the power amplifier circuitry and a second input coupled to the input of the power amplifier circuitry and adapted to generate the phase error measurements of the phase error between the phase of the input signal provided to the input of power amplifier circuitry and the phase of the output signal provided at the output of the power amplifier circuitry.

21. The system of claim 13 wherein the phase error detection circuitry comprises:
first downconversion circuitry coupled to the output of the power amplifier circuitry and adapted to provide a downconverted power amplifier output signal;
first limiting circuitry adapted to substantially remove an amplitude modulation component from the downconverted power amplifier output signal to provide a first signal;
second downconversion circuitry coupled to the input of the power amplifier circuitry and adapted to provide a downconverted power amplifier input signal;
second limiting circuitry adapted to substantially remove any amplitude modulation component from the downconverted power amplifier input signal to provide a second signal;
phase detection circuitry adapted to provide an error signal representative of a phase error between a phase of the first signal and a phase of the second signal;
filtering circuitry adapted to low-pass filter the error signal to provide an analog signal; and
analog-to-digital conversion circuitry adapted to sample the analog signal to provide the phase error measurements.

22. The system of claim 21 wherein the first downconversion circuitry comprises:
first mixing circuitry having a first input coupled to the output of the power amplifier circuitry and a second input adapted to receive a first local oscillator signal; and
first filtering circuitry adapted to filter an output of the first mixing circuitry to provide the downconverted power amplifier output signal.

23. The system of claim 22 wherein the second downconversion circuitry comprises:
second mixing circuitry having a first input coupled to the input of the power amplifier circuitry and a second input adapted to receive a second local oscillator signal; and
second filtering circuitry adapted to filter an output of the second mixing circuitry to provide the downconverted power amplifier output signal;
wherein the second mixing circuitry and the second filtering circuitry form at least a portion of a feedback path of a frequency synthesizer providing the input signal to the input of the power amplifier circuitry.

24. The system of claim 22 further comprising a frequency synthesizer comprising:
a fractional-N divider adapted to divide a reference signal based on a received modulation signal to provide a divided reference signal;
a phase detector adapted to compare a phase of the divided reference signal to a phase of a feedback signal to provide an error signal;
loop filtering circuitry adapted to low-pass filter the error signal to provide a control signal;
a controllable oscillator adapted to provide an oscillator output signal based on the control signal and having an output coupled to the input of the power amplifier circuitry;
second mixing circuitry having a first input coupled to the output of the controllable oscillator and a second input coupled to a second reference signal; and
second filtering circuitry adapted to filter an output of the second mixing circuitry to provide the feedback signal, wherein the second mixing circuitry and the second filtering circuitry form the second downconversion circuitry such that the feedback signal is the downconverted power amplifier input signal.

25. The system of claim 21 wherein the first limiting circuitry is further adapted to provide a power detection signal related to a power level seen at an input of the first limiting circuitry, the system further comprising:
power detection circuitry adapted to provide a signal indicative of a power level of an interferer signal present at an antenna of the transmitter prior to ramp-up based on the power detection signal; and
comparison circuitry adapted to compare the signal indicative of the power level of the interferer signal to a predetermined threshold, wherein the AM/PM compensation circuitry is further adapted to provide AM/PM compensation for the transmit burst based on seed compensation values rather than the phase error measurements if the predetermined threshold is exceeded, the seed compensation values being pre-determined under ideal load conditions.

26. The system of claim 13 further comprising a power detection system adapted to detect a power level of an interferer signal present at an antenna of the transmitter after ramp-down for a previous transmit burst when the power amplifier circuitry is disabled and an associated frequency synthesizer is stable and prior to ramp-up for the transmit burst when the power amplifier is disabled and the frequency synthesizer is stable;
  wherein the AM/PM compensation circuitry is further adapted to provide AM/PM compensation for the transmit burst based on seed compensation values pre-determined based on ideal load conditions rather than the phase error measurements if the power level of the interferer signal is above the predetermined threshold.

27. The system of claim 13 wherein the AM/PM compensation circuitry is further adapted to:
  determine whether a strong interferer signal is present at an antenna of the transmitter based on phase error measurements of the phase error between the phase of the input signal provided to the input of the power amplifier circuitry and the phase of the output signal provided at the output of the power amplifier circuitry during ramp-down for a previous transmit burst; and
  provide AM/PM compensation for the transmit burst based on seed compensation values pre-determined based on ideal load conditions rather than the phase error measurements if the strong interferer signal is present at the antenna.

28. A system for calibrating Amplitude Modulation to Phase Modulation (AM/PM) compensation in a transmitter operating according to a polar modulation scheme comprising:
  phase error detection circuitry adapted to obtain during ramp-up for a transmit burst phase error measurements of a phase error between a phase of an input signal provided to an input of power amplifier circuitry of the transmitter and a phase of an output signal provided at an output of the power amplifier circuitry; and
  AM/PM compensation circuitry adapted to:
    provide AM/PM compensation for the transmit burst based on the phase error measurements;
    determine whether a strong interferer signal is present at an antenna of the transmitter based on the phase error measurements; and
    provide AM/PM compensation for the transmit burst based on seed compensation values pre-determined based on ideal load conditions rather than the phase error measurements if the strong interferer signal is present at the antenna.

* * * * *